United States Patent
Yu et al.

(10) Patent No.: US 12,014,993 B2
(45) Date of Patent: Jun. 18, 2024

(54) PACKAGE HAVING REDISTRIBUTION LAYER STRUCTURE WITH PROTECTIVE LAYER AND METHOD OF FABRICATING THE SAME

(71) Applicant: Taiwan Semiconductor Manufacturing Company, Ltd., Hsinchu (TW)

(72) Inventors: Chen-Hua Yu, Hsinchu (TW); Kuo-Chung Yee, Taoyuan (TW); Chun-Hui Yu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 114 days.

(21) Appl. No.: 17/341,314

(22) Filed: Jun. 7, 2021

(65) Prior Publication Data

US 2021/0296252 A1    Sep. 23, 2021

Related U.S. Application Data

(63) Continuation of application No. 16/114,246, filed on Aug. 28, 2018, now Pat. No. 11,031,344.

(51) Int. Cl.
  *H01L 23/538* (2006.01)
  *H01L 21/48* (2006.01)
  (Continued)

(52) U.S. Cl.
  CPC ...... *H01L 23/5389* (2013.01); *H01L 21/4853* (2013.01); *H01L 21/4857* (2013.01); *H01L 21/565* (2013.01); *H01L 23/3107* (2013.01); *H01L 23/5383* (2013.01); *H01L 23/5386* (2013.01); *H01L 24/19* (2013.01); *H01L 24/20* (2013.01); *H01L 25/105* (2013.01); *H01L 25/50* (2013.01); *H01L 2224/214* (2013.01); *H01L 2225/1035* (2013.01); *H01L 2225/1058* (2013.01); *H01L 2924/365* (2013.01)

(58) Field of Classification Search
  CPC ............ H01L 23/5389; H01L 21/4853; H01L 21/4857; H01L 21/565; H01L 23/3107; H01L 23/5386; H01L 24/19; H01L 25/105; H01L 25/50
  USPC ........................................................ 257/668
  See application file for complete search history.

(56) References Cited

U.S. PATENT DOCUMENTS 8,993,380 B2   3/2015   Hou et al.
9,281,254 B2   3/2016   Yu et al.
(Continued)

*Primary Examiner* — Xia L Cross
(74) *Attorney, Agent, or Firm* — JCIPRNET

(57) ABSTRACT

Provided is a method of fabricating a package including: providing a die with a contact thereon; forming a redistribution layer (RDL) structure on the die, the forming the RDL structure on the die comprising: forming a first dielectric material on the die; forming a conductive feature in and partially on the first dielectric material; after the forming the conductive feature, forming a protective layer on the conductive feature, wherein the protective layer covers a top surface of the conductive feature and extends to cover a top surface of the first dielectric material; forming a second dielectric material on the protective layer; and performing a planarization process to expose the conductive feature; and forming a plurality of conductive connectors to electrically connect the die through the RDL structure.

20 Claims, 19 Drawing Sheets

(51) Int. Cl.
*H01L 21/56* (2006.01)
*H01L 23/00* (2006.01)
*H01L 23/31* (2006.01)
*H01L 25/00* (2006.01)
*H01L 25/10* (2006.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,620,482 B1* | 4/2017 | Chen ................. H01L 21/78 |
| 9,666,502 B2 | 5/2017 | Chen et al. |
| 9,735,131 B2 | 8/2017 | Su et al. |
| 2017/0117253 A1* | 4/2017 | Yu ..................... H01L 24/94 |

* cited by examiner

PACKAGE HAVING REDISTRIBUTION LAYER STRUCTURE WITH PROTECTIVE LAYER AND METHOD OF FABRICATING THE SAME

CROSS-REFERENCE TO RELATED APPLICATION

This application is a continuation application of and claims the priority benefit of a prior application Ser. No. 16/114,246, filed on Aug. 28, 2018, now allowed. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
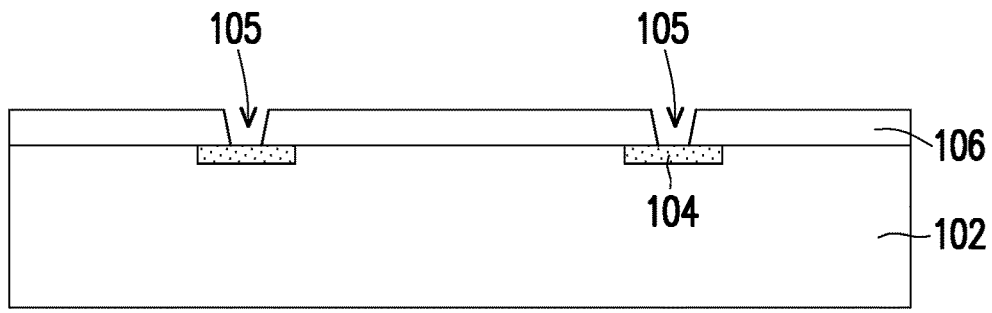
FIG. 1A to FIG. 1K are cross-sectional views of a method of forming a package in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are cross-sectional views of a method of forming a package in accordance with a first embodiment.

Referring to FIG. 1A, a die 102 having a plurality of contacts 104 is provided. In some embodiments, the die 102 is a semiconductor wafer having plural semiconductor chips therein, for example. The semiconductor chips may be an application-specific integrated circuit (ASIC) chip, an analog chip, a sensor chip, a wireless and radio frequency chip, a voltage regulator chip or a memory chips. In some alternative embodiments, the die 102 is a reconstituted wafer including a plurality of dies molded in an encapsulant, for example. The wafer may be a semiconductor substrate such as a silicon substrate. The substrate is, for example, a bulk silicon substrate, a doped silicon substrate, an undoped silicon substrate, or a silicon-on-insulator (SOI) substrate. The dopant of the doped silicon substrate may be an N-type dopant, a P-type dopant or a combination thereof. The substrate may also be formed by the other semiconductor materials. The other semiconductor materials include but are not limited to silicon germanium, silicon carbide, gallium arsenide, or the like. The substrate may include active areas and isolation structures (not shown). In other embodiments, the die 102 may include other conductive layers, doped regions or other semiconductor devices, such as transistors, diodes or the like. The embodiments are intended for illustration purposes but not intended to limit the scope of the present disclosure.

In some embodiments, the contacts 104 are electrically connected to the semiconductor devices (not shown) in the die 102. The contacts 104 may include solder bumps, gold bumps, copper bumps, copper posts, or the like. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The contacts 104 are formed by physical vapor deposition (PVD) or electroplating, for example. In some alternative embodiments, the contact 104 may include connection pads, such as aluminum pad, for example.

As shown in FIG. 1A, a first dielectric material 106 having a plurality of via openings 105 is formed on the die 102. The via openings 105 respectively correspond to and expose the contacts 104. The first dielectric material 106 may be a single layer or a multilayer structure, for example. In some embodiments, a material of the first dielectric material 106 includes an inorganic dielectric material, an organic dielectric material, or a combination thereof. The inorganic dielectric material is, for example, silicon oxide, silicon nitride, silicon oxynitride, or a combination thereof. The organic dielectric material may include polymer. The polymer includes a photosensitive material, a non-photosensitive material, or a combination thereof. In some embodiments, the photosensitive material includes polybenzoxazole (PBO), polyimide, benzocyclobutene (BCB), positive photoresist, negative photoresist, a combination thereof, and/or the like. The non-photosensitive material includes Ajinomoto buildup film (ABF). The first dielectric material 106 may be formed by chemical vapor deposition, spin coating, or lamination. In some embodiments, the first dielectric material 106 has a thickness in the range of 0.5 μm to 5 μm.

As shown in FIG. 1A, in some embodiments, the first dielectric material 106 is patterned by performing a lithographic process and an etching process. In some alternative embodiments, the first dielectric material 106 is partially removed through exposure and developing processes. In certain embodiments, the first dielectric material 106 is partially removed or patterned by performing a laser ablation process.

Figure 1B:
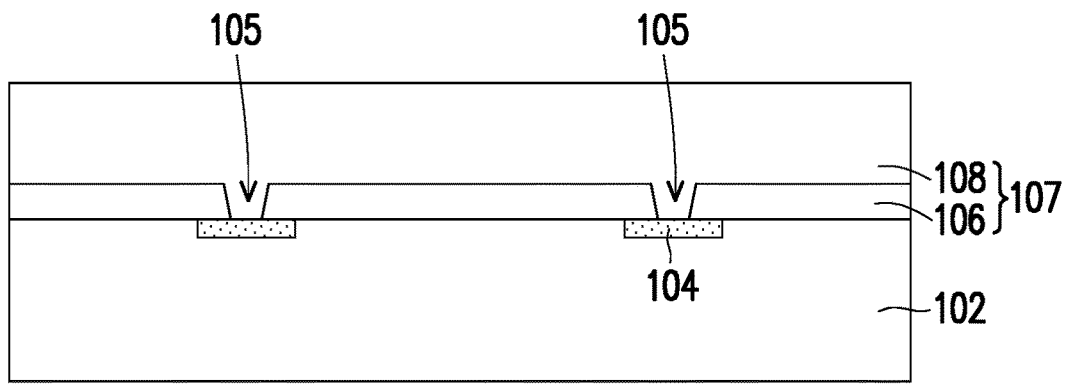

Referring to FIG. 1A and FIG. 1B, a second dielectric material 108 is formed on the first dielectric material 106 and filled in the via openings 105. The second dielectric material 108 may be a single layer or a multilayer structure, for example. In some embodiments, a material of the second dielectric material 108 includes an inorganic dielectric material, an organic dielectric material, or a combination thereof. The inorganic dielectric material is, for example, silicon oxide, silicon nitride, silicon oxynitride, or a combination thereof. The organic dielectric material may include polymer. The polymer includes a photosensitive material, a non-photosensitive material, or a combination thereof. In some embodiments, the photosensitive material includes PBO, polyimide, BCB, positive photoresist, negative photoresist, a combination thereof, and/or the like. The non-photosensitive material includes ABF. The second dielectric material 108 may be formed by chemical vapor deposition, spin coating, or lamination. In some embodiments, the second dielectric material 108 has a thickness in the range of 0.5 μm to 5 μm.

In some embodiments, a material of the second dielectric material 108 is different from a material of the first dielectric material 106, and the second dielectric material 108 and the first dielectric material 106 constitute a stacked dielectric layer 107. In some embodiments, the first dielectric material 106 and the second dielectric material 108 have the same material.

Figure 1C:
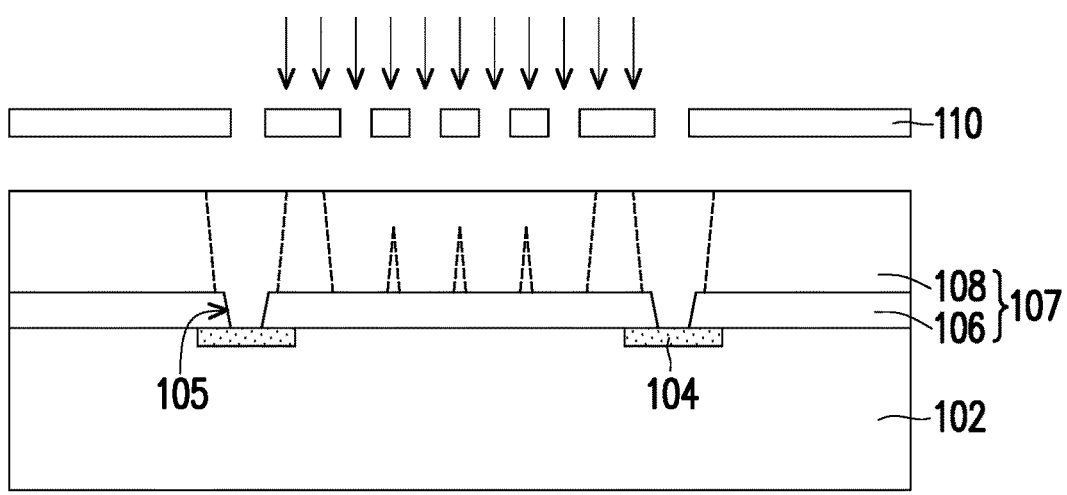
Figure 1D:
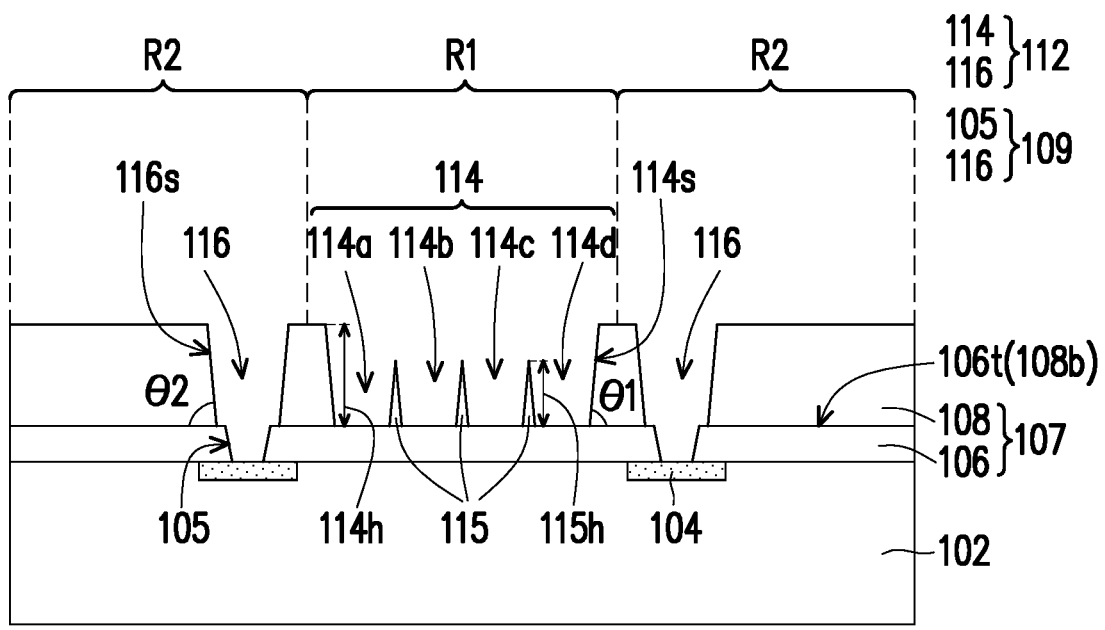

Referring to FIG. 1C and FIG. 1D, the dielectric layer 107 is patterned or partially removed to form a plurality of trench openings 112 in the second dielectric material 108 and form the via openings 105 in the first dielectric material 106. In the embodiment, as shown in FIG. 1C, when the dielectric layer 107 is the photosensitive polymer material, the patterning method may include a lithographic process (which includes exposure and development processes) or a laser ablation process by using a mask 110. In some alternative embodiments, when the dielectric layer 107 is the non-photosensitive material or the inorganic dielectric material, the patterning method may include a lithographic process and an etching process, such as a plasma etching process. However, the embodiments of the present invention are not limited thereto, any patterning method that may remove the dielectric layer 107 is within the scope of the disclosure.

After patterning the dielectric layer 107, as shown in FIG. 1D, the trench openings 112 and the via openings 105 are formed in the dielectric layer 107. In detail, the trench openings 112 includes a first trench opening 114 in the first region R1 and second trench openings 116 in the second region R2. The first region R1 is aside or surrounded by the second region R2. In some embodiments, the first region R1 is referred as a dense region and the second region R2 is referred as a sparse region. Herein, the dense region is referred as a pitch between sub-openings 114a, 114b, 114c, and 114d of the first trench openings 114 less than a pitch between the first trench opening 114 and the second trench opening 116 (or a pitch between one and another second trench openings 116). As shown in FIG. 1D, the sub-openings 114a, 114b, 114c, and 114d constitute as the first trench opening 114 with a plurality of comb portions 115. The comb portions 115 extend from a top surface 106t of the first dielectric material 106 upward. In some embodiments, a height 115h of the comb portions 115 is less than or equal to a depth 114h of the first trench opening 114.

As shown in FIG. 1D, the second trench openings 116 are formed on and in spatial communication with the via openings 105. The joined second trench openings 116 and via openings 105 constitute as dual damascene openings 109. The dual damascene openings 109 expose the contacts 104 of the die 102. In some embodiments, the first trench opening 114 is referred as a single damascene opening.

As shown in FIG. 1D, the first trench opening 114 has a sidewall 114s. In some embodiments, an included angle θ1 exists between the sidewall 114s of the first trench opening 114 and the bottom surface 108b of the second dielectric material 108. Similarly, the second trench opening 116 has a sidewall 116s. An included angle θ2 exists between the sidewall 116s of the second trench opening 116 and the bottom surface 108b of the second dielectric material 108. The included angle θ1 and the included angle θ2 may be the same or different. The included angles θ1 and θ2 may be adjusted by using different materials for the dielectric layer 107 and controlling the associated removal process conditions. In some embodiments, the included angles θ1 and θ2 are respectively ranging from 80 degrees to 90 degrees.

Figure 1E:
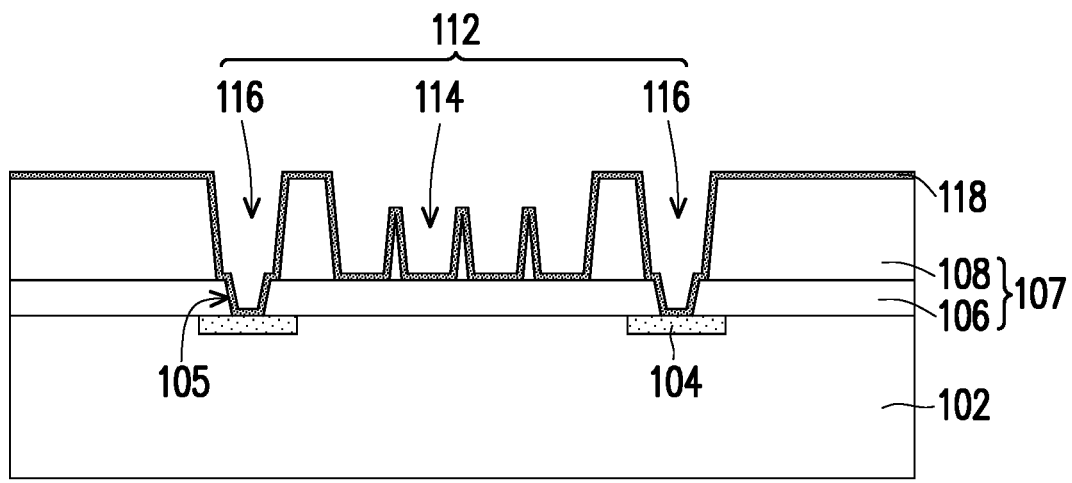
Figure 1F:
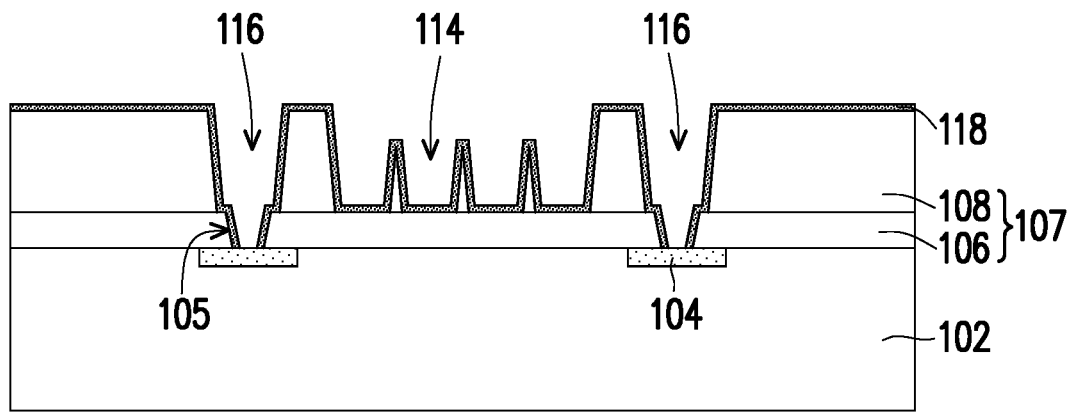

Referring to FIG. 1E and FIG. 1F, a protective layer 118 is formed on the die 102. In detail, the protective layer 118 conformally covers the second dielectric material 108 and surfaces of the trench openings 112 and the via openings 105. In some embodiments, the protective layer 118 includes an inorganic dielectric material. The inorganic dielectric material may include an oxide (such as silicon oxide), a nitride (such as silicon nitride), an oxynitride (such as silicon oxynitride), a carbide (such as silicon carbide), or a combination thereof, for example. The method of forming the protective layer 118 is, for example, a chemical vapor deposition (CVD) process, a physical vapor deposition (PVD) process, or an atomic layer deposition (ALD) process. In other embodiments, a thickness of the protective layer 118 is less than 1 μm. Herein, when a layer described as "conformally cover", the layer is formed with an uniform thickness.

After the protective layer 118 is formed, as shown in FIG. 1F, the protective layer 118 on a bottom surface of the via openings 105 is removed to expose the contacts 104 of the die 102. In some embodiments, the method of removing the protective layer 118 on a bottom surface of the via openings 105 includes forming a photoresist pattern (not shown) with openings corresponding to the contacts 104, performing an etching process to remove a portion of the protective layer 118 by using the photoresist pattern as an etching mask, and removing the photoresist pattern.

Figure 1G:
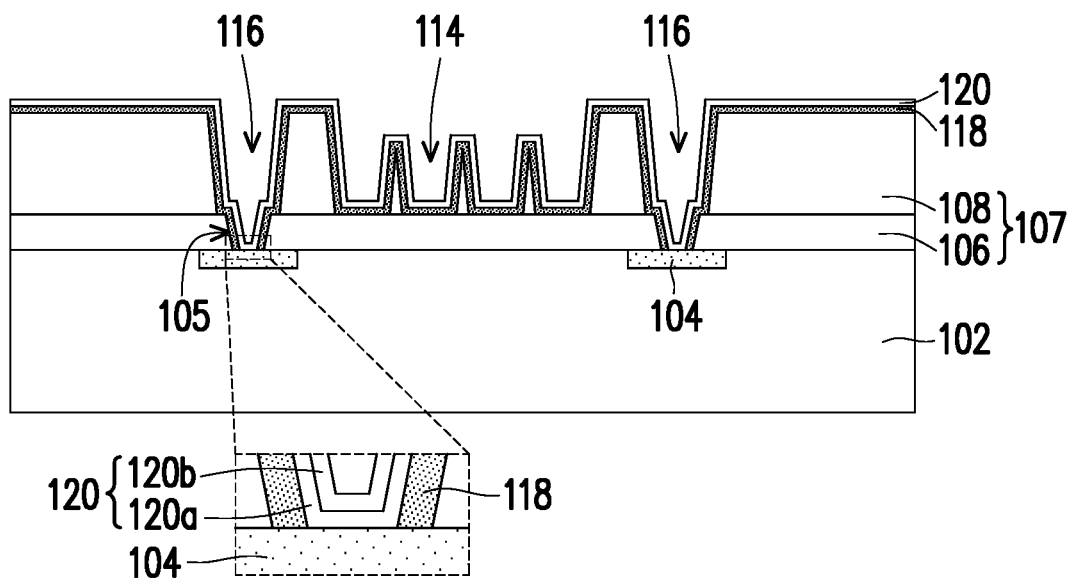

Referring to FIG. 1G, after the contacts 104 are exposed by the protective layer 118, a seed layer 120 is formed on the die 102. In detail, the seed layer 120 conformally covers the protective layer 118 and is in contact with the contacts 104 of the die 102. In some embodiments, the seed layer 120 is a conformal seed layer. The forming method thereof includes a CVD process or a PVD process. The PVD process is, for example, sputtering. In an embodiment, the seed layer 120 and the protective layer 118 include different materials. In some embodiments, the seed layer 120 is a metal layer, which may be a single layer or a composite layer including a plurality of sub-layers formed of different materials. In other embodiments, the seed layer 120 is, for example, a titanium/copper composited layer, wherein the sputtered titanium thin film 120a is in contact the contacts 104 of the die 102, and the sputtered copper thin film 120b is then formed over the sputtered titanium thin film 120a, as shown in the enlarged view of FIG. 1G. In some alternative embodiments, the seed layer 120 may be other suitable composited layer such as metal, alloy, barrier metal, or a combination thereof.

Figure 1H:
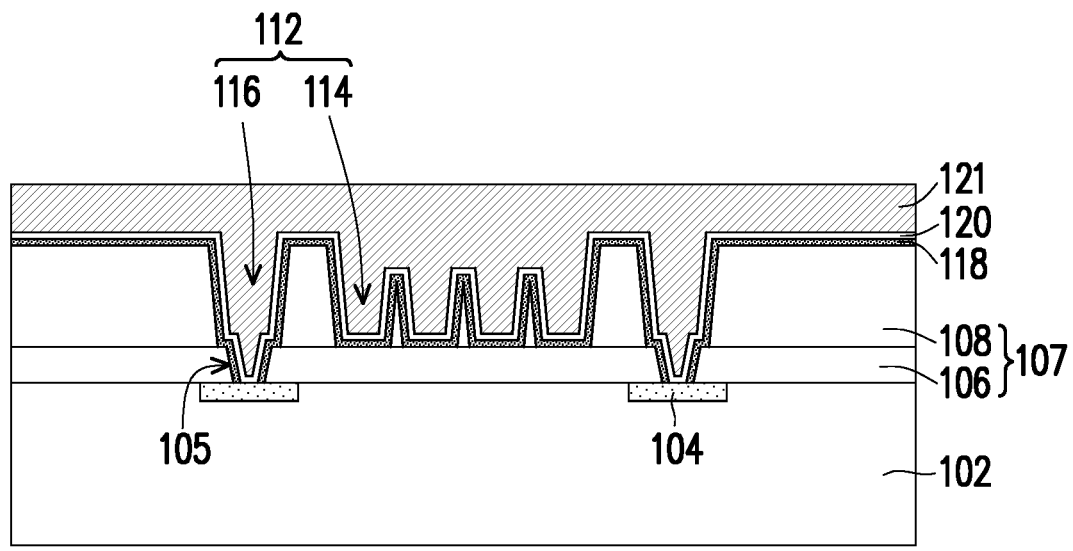

Referring to FIG. 1H, a conductive material 121 is formed on the seed layer 120 by a plating process, for example. In detail, the conductive material 121 is filled in the trench openings 112 and the via openings 105 and extends to cover the top surface of the dielectric layer 107. In some embodiments, the conductive material 121 includes copper or other suitable metal, for example. In an embodiment, the conductive material 121 and the protective layer 118 include different materials. In some alternatively embodiments, the conductive material 121 is formed by a CVD process or a PVD process. The PVD process is, for example, sputtering.

Figure 1I:
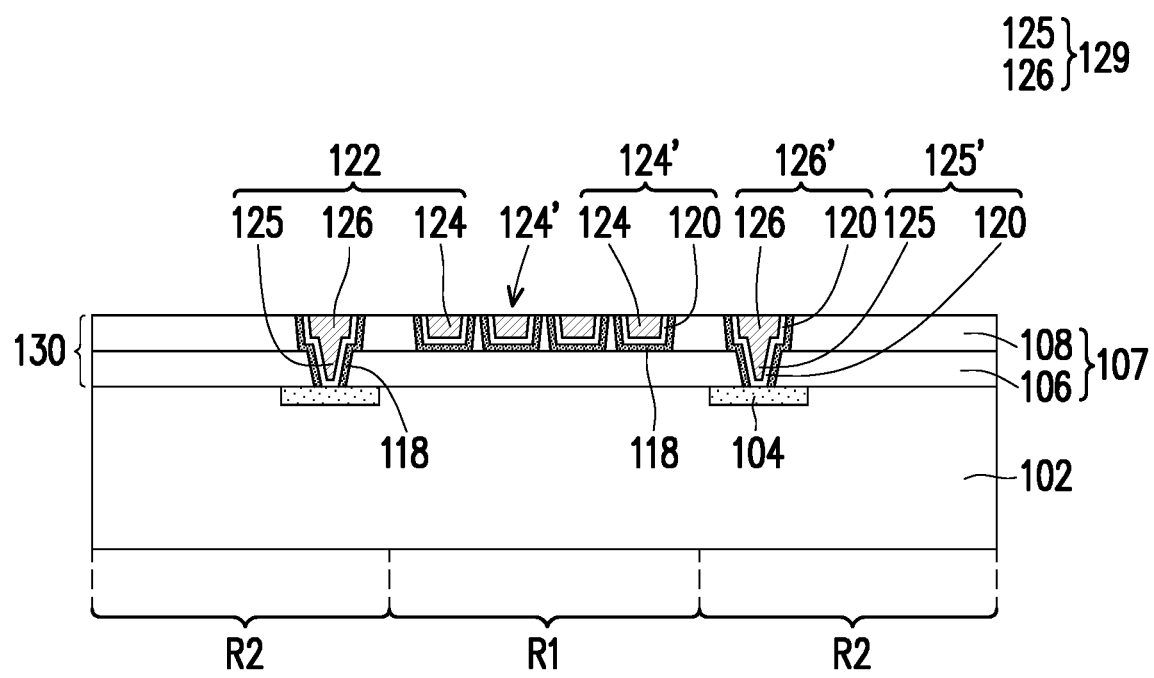

Referring to FIG. 1H and FIG. 1I, a planarization process is performed to remove portions of the conductive material 121, the seed layer 120, the protective layer 118, and a portion of the second dielectric material 108 until the comb portions 115 are exposed. In the embodiment, portions of the comb portions 115 are also removed by the planarization process. In some embodiments, the planarization process includes a chemical-mechanical polishing (CMP) process, a mechanical grinding process, a fly cutting process or an etching back process. In certain embodiments, after the planarization process, the formation of the first redistribution layer (RDL) structure 130 is completed.

After the planarization process, as shown in FIG. 1I, a plurality of the conductive features 122 are formed in the trench openings 112 and via openings 105. In detail, as shown in FIG. 1I, the conductive features 122 includes a plurality of first conductive patterns 124 in the first region R1 and a plurality of second conductive patterns 126 and a plurality of third conductive patterns 125 in the second region R2.

Referring to FIG. 1I, in the first region R1, the first conductive patterns 124 are separated from each other by the comb portions 115. The first conductive patterns 124 are referred as single damascene conductive patterns. The protective layer 118 is formed on the bottom surfaces and the sidewalls of the first conductive patterns 124. The seed layer 120 is formed between the protective layer 118 and the first conductive patterns 124. In some embodiments, the first conductive patterns 124 and the seed layer 120 conformally formed on the bottom surfaces and the sidewalls of the first conductive patterns 124 constitute first traces 124'. The first traces 124' extend along a direction parallel to the top surface of the die 102.

Referring to FIG. 1I, in the second region R2, the second conductive patterns 126 are formed on the third conductive patterns 125 respectively. The joined second conductive pattern 126 and third conductive pattern 125 constitute as a dual damascene conductive pattern 129. The protective layer 118 is formed on the sidewalls of the second conductive patterns 126 and the third conductive pattern 125 (or the sidewalls of the dual damascene conductive patterns 129). Further, the protective layer 118 further extends from the sidewalls of the third conductive pattern 125 to cover a portion of the top surface of the first dielectric material 106 and cover the sidewalls of the second conductive patterns 126. The seed layer 120 is formed between the protective layer 118 and the dual damascene conductive patterns 129. In some embodiments, the second conductive patterns 126 and the seed layer 120 formed on the sidewalls of the second conductive patterns 126 constitute second traces 126'. The second traces 126' extend along a direction parallel to the top surface of the die 102. The third conductive patterns 125 and the seed layer 120 formed on the bottom surface and the sidewalls of the third conductive patterns 125 constitute vias 125'. The vias 125' extend along a direction perpendicular to the top surface of the die 102.

Referring to FIG. 1I, in some embodiments, a top surface of the dielectric layer 107 and top surfaces of the conductive features 122 are substantially coplanar or at the same level. In some embodiments, through the dual damascene process, the formed first RDL structure 130 provides good planarity for the to-be-formed upper layers. Compared with semi-additive processes (SAP), the manufacturing processes described in the above embodiments fabricate the package with the dual and single damascene conductive patterns have lower costs and lower transmission loss, and such structures are applicable for high density applications or high frequency applications.

In some embodiments, as shown in FIG. 1I, a density of the first traces 124' in the first region R1 is greater than or equal to a density of the second traces 126' in the second region R2. That is, the pitch between the first traces 124' is less than or equal to the pitch between the second traces 126'. By removing the seed layer 120 and the protective layer 118 on the comb portions 115 and portions of the comb portions 115, it is able to make sure each of the first traces 124' is independent and not connected to adjacent first trace 124'. Therefore, even if the line widths of the first traces 124' and the spacing between the first traces 124' reduce, the desired first traces 124' may be fabricated by performing steps as described in FIG. 1A to FIG. 1I. In other words, the fabricating method described in FIG. 1A to FIG. 1I is able to achieve a high resolution of the RDL structure by using a convention lithographic tool, such as g-line, i-line, and/or h-line. In the case, a fine pitch RDL structure is fabricated without any expensive lithographic tool, the fabricating costs accordingly decrease.

It should be noted that, in some embodiments, the protective layer 118 is able to avoid the dielectric breakdown of the dielectric layer 107 in the first RDL structure 130 when the protective layer 118 is the inorganic dielectric material. Specifically, the protective layer 118 is formed on the bottom surfaces and the sidewalls of the first traces 124' in the first region R1, and formed on the sidewalls of the second traces 126' and the via 125' in the second region R2. That is, the protective layer 118 encapsulates the first traces 124', the second traces 126', and the via 125' to increase the breakdown voltage of the first RDL structure 130, especially in the fine pitch RDL structure. Therefore, the electrically reliability of the package 100 (as shown in FIG. 1K) is enhanced because of the protective layer 118 with the inorganic dielectric material.

In some alternative embodiments, the protective layer 118 is able to avoid the metal of the conductive features 122 from migrating to or diffusion to the die 102 when the protective layer 118 is the barrier metal. Therefore, the electrical short of the package 100 (as shown in FIG. 1K) is prevented because of the protective layer 118 with the barrier metal.

Figure 1J:
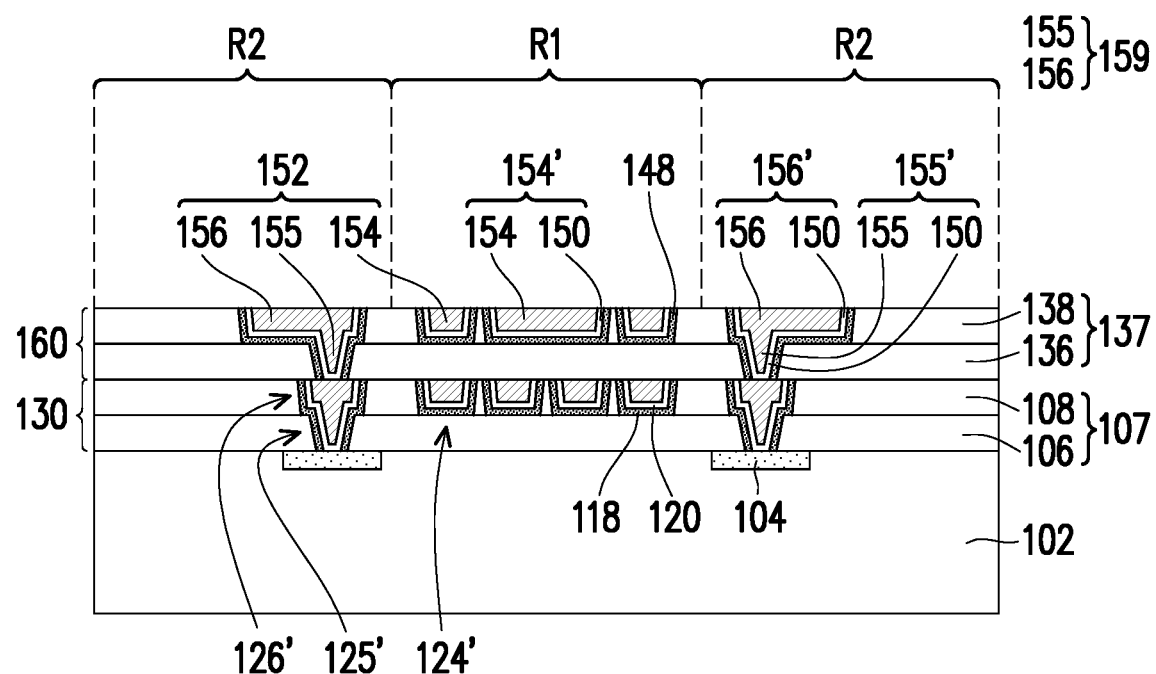
Figure 1K:
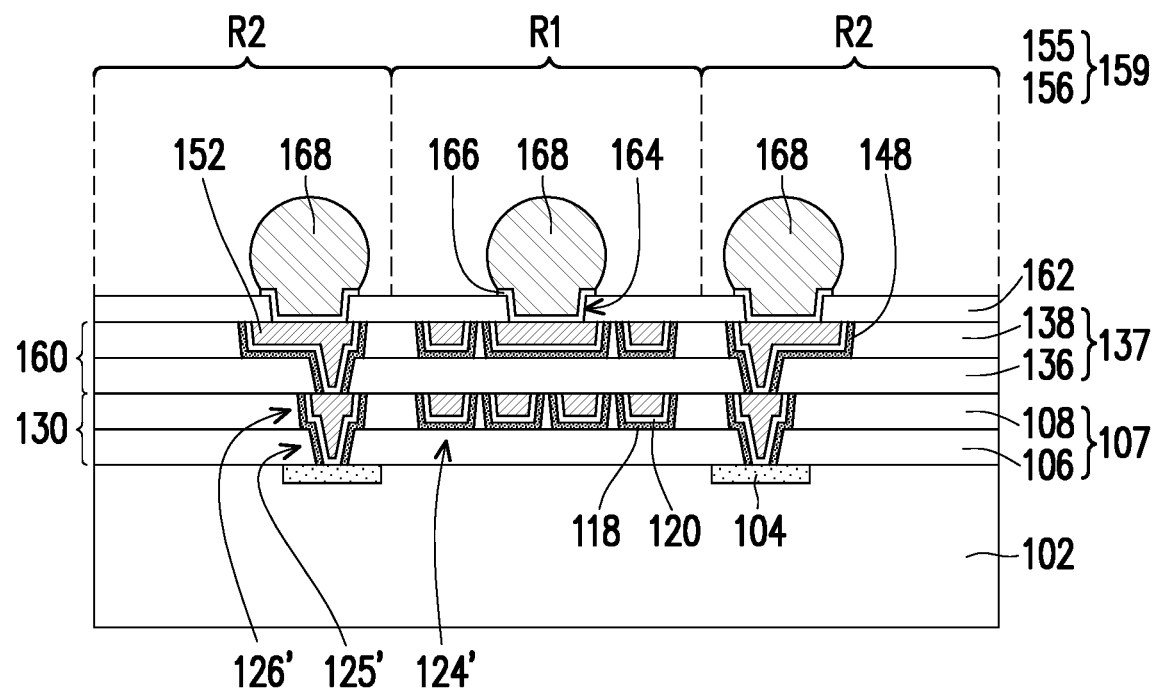

Referring to FIG. 1J, a second RDL structure 160 is formed on the first RDL structure 130. The formation of the second RDL structure 160 may follow the same or substantially similar process steps as described in FIG. 1A to FIG. 1I and use the same or similar materials as described in the above embodiments. In some embodiments, the second RDL structure 160 is disposed on the first RDL structure 130 and is electrically connected with the first RDL structure 130. In some embodiments, the second RDL structure 160 includes a dielectric layer 137 and a plurality of conductive features 152 formed in the dielectric layer 137. In some embodiments, the dielectric layer 137 may include a first dielectric material 136 and a second dielectric material 138 on the first dielectric material 136. In some embodiments, the conductive features 152 include a plurality of first conductive patterns 154 in the second dielectric material 138 within the first region R1, a plurality of second conductive patterns 156 in the second dielectric material 138 within the second region R2, and a plurality of third conductive patterns 155 in the first dielectric material 136 within the second region R2. In some embodiments, the second conductive pattern 156 is formed on the third conductive pattern 155, and the joined second conductive pattern 156 and the third conductive pattern 155 constitute as a dual damascene conductive pattern 159. The first conductive patterns 154 are separated from each other and referred as single damascene conductive patterns.

Referring to FIG. 1J, in some embodiments, a protective layer 148 is conformally formed on the bottom surfaces and the sidewalls of the first conductive patterns 154 within the first region R1. The protective layer 148 is also conformally formed on bottom surfaces and the sidewall of the second conductive patterns 156 and the sidewalls of the third conductive patterns 155. In other words, the protective layer 148 is not formed to cover a bottom surface of the third conductive patterns 155. A seed layer 150 is formed between the protective layer 148 and the conductive features 152. In some embodiments, in the first region R1, the first conductive patterns 154 and the seed layer 150 conformally formed on the bottom surfaces and the sidewalls of the first conductive patterns 154 constitute first traces 154'. The first traces 154' extend along a direction parallel to the top surface of the die 102. In the second region R2, the second conductive patterns 156 and the seed layer 150 formed on the sidewalls and the bottom of the second conductive patterns 156, and the seed layer 150 constitute second traces 156'. The second traces 156' extend along a direction parallel to the top surface of the die 102. Further, in the second region R2, the third conductive patterns 155 and the seed layer 150 formed on the sidewalls and the bottom surface of the third conductive patterns 155 constitute vias 155'. The vias 155' extend along a direction perpendicular to the top surface of the die 102 to connect to the second traces 126'and the second traces 156'. As shown in FIG. 1J, top surfaces of the second traces 156' and the first traces 154' and a top surface of the dielectric layer 137 are substantially coplanar or at the same level.

In some embodiments, as shown in FIG. 1J, the locations of the vias 155' are vertically (along a direction perpendicular to the top surface of the die 102) aligned with the locations of the vias 125'. That is, one of the vias 155' and the corresponding via 125' constitute as a stacked via structure. In some alternative embodiments, the vias 155' may be formed on the first trace 124' without any via therebelow.

Although only two RDL structures 130 and 160 are illustrated in FIG. 1J, the embodiments of the present invention are not limited thereto. In some embodiments, one or more RDL structures are formed between the first RDL structure 130 and the second RDL structure 160. That is, one or more dielectric layers and conductive features formed in the one or more dielectric layers are included in the RDL structures. However, the layout or the arrangement of the RDL structures is not limited by the embodiments described herein.

The method for forming the first RDL structure 130 in FIG. 1A to FIG. 1I is referred as a via-first process. However, the embodiments of the present invention are not limited thereto. In other embodiments, the forming method of the first and second RDL structures 130 and 160 may include a trench-first process. The trench-first process may include forming the first trench openings 114 and the second trench opening 116 in the second dielectric material 108, and then forming the via openings 105 in the first dielectric material 106.

Referring to FIG. 1J and FIG. 1K, after the second RDL structure 160 is formed, a passivation layer 162 is formed on the second RDL structure 160. The passivation layer 162 may be a single layer or a multilayer structure, the material thereof is an insulating material, such as silicon oxide, silicon nitride, a polymer, or a combination thereof. The polymer may be a photosensitive material, a non-photosensitive material, or a combination thereof. The polymer is, for instance, PBO, polyimide, BCB, or a combination thereof.

The passivation layer 162 is formed by, for instance, a CVD, spin coating, or a combination thereof. Thereafter, a plurality of openings 164 are formed in the passivation layer 162. The openings 164 expose portions of the conductive features 152 of the second RDL structure 160. In some embodiments, the method of forming the openings 164 includes exposure and development processes. In other embodiments, the method of forming the openings 164 includes lithographic and etching processes.

As shown in FIG. 1K, in some embodiments, a conductive layer 166 is formed on the conductive features 152 exposed by the openings 164. The conductive layer 166 is also referred to as under-ball metallurgy (UBM). In some embodiments, the conductive layer 166 covers the sidewalls and the bottoms of the openings 164 and extends to cover the passivation layer 162. The material of the conductive layer 166 includes a metal or a metal alloy. The conductive layer 166 is, for example, copper, tin, an alloy thereof, or a combination thereof. The conductive layer 166 is formed by, for instance, PVD or a plating process. The conductive layer 166 is electrically connected to the contacts 104 of the die 102 through the first and second RDL structures 130 and 160.

Thereafter, a plurality of conductive connectors (also referred to as conductive balls) 168 is placed on the conductive layer 166. After the conductive connectors are formed, as shown in FIG. 1K, the package 100 of the first embodiment of the disclosure is thus completed. In some embodiments, a material of the conductive connectors 168 includes copper, aluminum, lead-free alloys (e.g., gold, tin, silver, aluminum, or copper alloys) or lead alloys (e.g., lead-tin alloys). In some embodiments, the conductive connectors 168 are placed on the conductive layer 166 by a ball mounting process. The conductive connectors 168 are electrically connected to the contacts 104 of the die 102 through the conductive layer 166 and the first and second RDL structures 130 and 160.

In FIG. 1K, the first and second RDL structures 130 and 160 are front-side redistribution layers formed on the active surface of the die 102. In some embodiments, the structure in FIG. 1K may be a wafer level chip scale package (WLCSP) structure. In some alternative embodiments, the die 102 and the first and second RDL structures 130 and 160 have substantially the same size. Herein, the term "size" is referred to the length, width, or area. For example, as shown in FIG. 1K, the width of the die 102 is equal to the width of the first and second RDL structures 130 and 160. In the case, the package 100 may be an integrated fan-in package.

In some embodiments, the first and second RDL structures 130 and 160 with the protective layers 118 and 148 illustrated in FIG. 1K are able to apply in various packages. Therefore, the packages having the RDL structures with the protective layer are able to increase the breakdown voltage of the RDL structures, so that the packages achieve the fine pitch RDL or high density RDL. The details will be described as following descriptions of FIG. 2 to FIG. 8.

Figure 2:
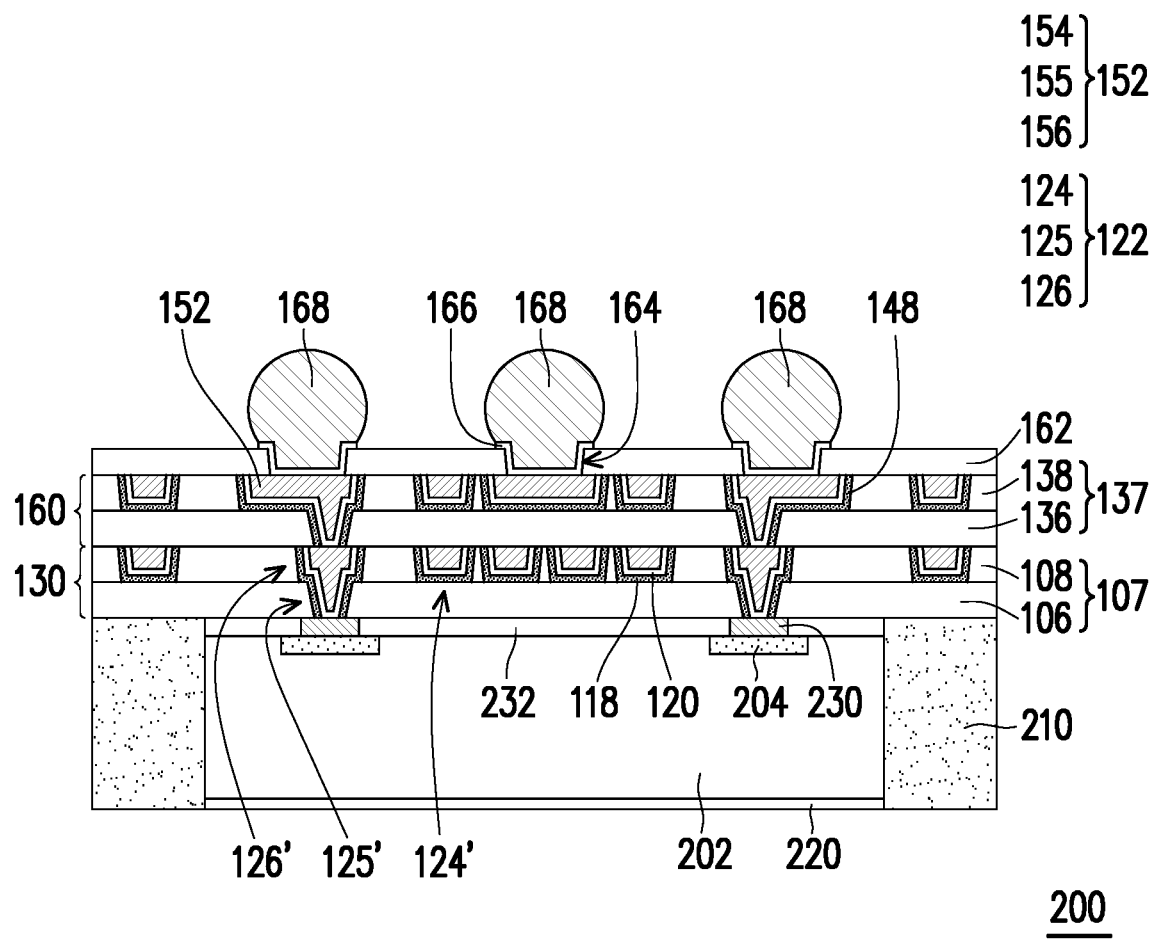
FIG. 2 is a cross-sectional view of a package in accordance with a second embodiment.

FIG. 2 is a cross-sectional view of a package in accordance with a second embodiment.

Referring to FIG. 2, an integrated fan-out (InFO) package 200 includes a die 202 having a plurality of contacts 204, a plurality of connectors 230, a passivation layer 232, an encapsulant 210, the first and second RDL structures 130 and 160, and the conductive connectors 168. Although only one die 202 illustrated in FIG. 2, the die 202 may include more than one die, such as two dies, three dies or more dies.

In detail, the connectors 230 are formed on and connected to the contacts 204 of the die 202. In some embodiments, the connectors 230 may include solder bumps, gold bumps, copper bumps, copper posts, or the like. In the case, the contacts 204 may be connection pads, while the connectors 230 may be copper posts. The passivation layer 232 laterally covers the connectors 230, and the die 202 is laterally encapsulated by the encapsulant 210. In some embodiments, the die 202 is a semiconductor wafer having plural semiconductor chips therein, for example. The semiconductor chips may be an application-specific integrated circuit (ASIC) chip, an analog chip, a sensor chip, a wireless and radio frequency chip, a voltage regulator chip or a memory chips.

In some embodiments, the forming the passivation layer 232 and the encapsulant 210 includes following steps. A passivation material (not shown) is formed to cover the connectors 230 and the die 202 by a suitable fabrication technique such as spin-coating, lamination, deposition, or the like. An encapsulant material encapsulates sidewalls of the die 202 and a top surface of the passivation material by a suitable fabrication technique such as spin-coating, lamination, deposition, molding or similar processes. Thereafter, a grinding or polishing process is performed to remove a portion of the encapsulant material and a portion of the passivation material, such that the connectors 230 are exposed. In the case, the top surfaces of the passivation layer 232, the connectors 230, and the encapsulant 210 are substantially leveled or coplanar.

In some embodiments, the encapsulant 210 includes a molding compound, a molding underfill, a resin such as epoxy, a combination thereof, or the like. In some embodiments, the encapsulant 210 includes a photo-sensitive material such as PBO, polyimide, BCB, a combination thereof, or the like, which may be easily patterned by exposure and development processes. In alternative embodiments, the encapsulant 210 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the passivation layer 232 may be a single layer structure or a multilayer structure. In some alternatively embodiments, the passivation layer 232 includes an insulating material such as silicon oxide, silicon nitride, polymer, or a combination thereof. The polymer is, for instance, PBO, polyimide, BCB, a combination thereof, or the like.

As shown in FIG. 2, the first and second RDL structures 130 and 160 are formed on the encapsulant 210 and over the die 202. The first and second RDL structures 130 and 160 are electrically connected to the die 202 through the contacts 204 and connectors 230. In some embodiments, the first RDL structure 130 includes one or more conductive features 122 in the dielectric layer 107 and the second RDL structure 160 includes one or more conductive features 152 in the dielectric layer 137. The formation of the first and second RDL structures 130 and 160 is similar to the formation of the first and second RDL structures 130 and 160 as described in FIG. 1A-FIG. 1J. Thus, details thereof are omitted here.

It should be noted that the protective layer 118 is formed between the conductive features 122 and the dielectric layer 107, and the protective layer 148 is formed between the conductive features 152 and the dielectric layer 137, so as to increase the breakdown voltage of the first and second RDL structures 130 and 160. In the case, the InFO package 200 is suitable for a package having a high density RDL.

As shown in FIG. 2, the conductive connectors 168 are formed on and electrically connected to the second RDL structure 160. In some embodiments, the conductive connectors 168 may be bumps, controlled collapse chip connection (C4) bumps or ball grid array (BGA) balls. In the case, as shown in FIG. 2, the conductive connectors 168 are BGA balls.

Figure 3:
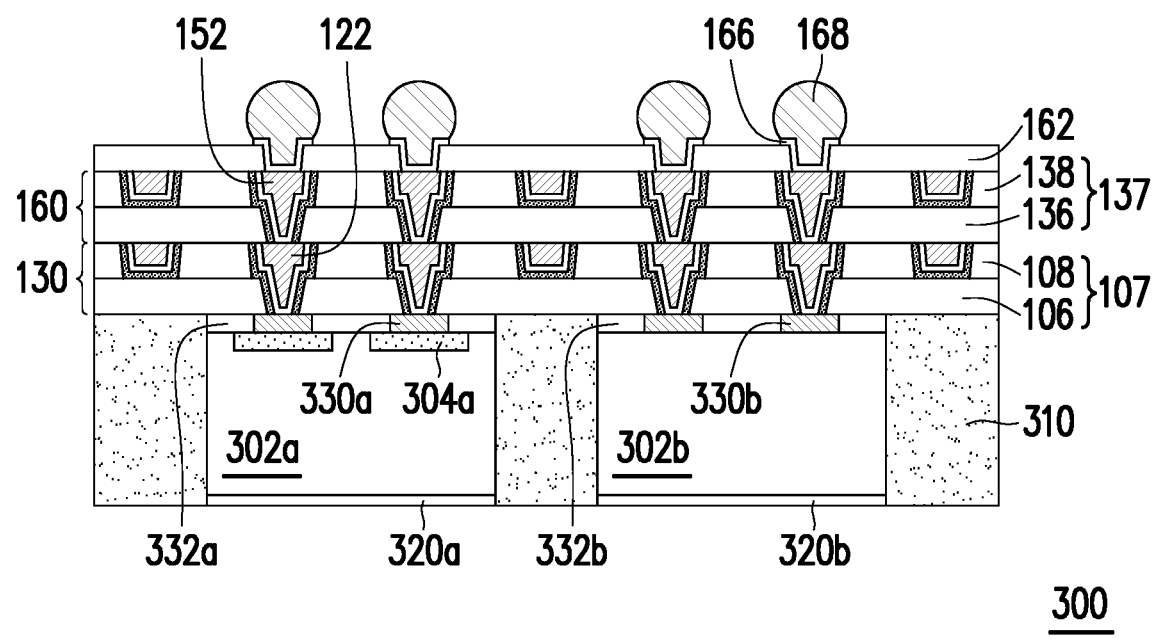
FIG. 3 is a cross-sectional view of a package in accordance with a third embodiment.

FIG. 3 is a cross-sectional view of a package in accordance with a third embodiment.

Referring to FIG. 3, an InFO package 300 of the third embodiment is similar to the InFO package 200 of the second embodiment illustrated in FIG. 2. A difference therebetween lies in that the InFO package 300 includes a first die 302a and a second die 302b arranged side by side. The first die 302a and the second die 302b are encapsulated by an encapsulant 310. The first die 302a and the second die 302b may have the same function or different functions. In some embodiments, the first die 302a includes a system-on-a-chip (SoC) die or an application specific integrated circuit (ASIC) chip, and the second die 302b includes a memory chip or a high bandwidth memory chip. In detail, the first die 302a has a plurality of contacts 304a. A plurality of connectors 330a are formed on and connected to the contacts 304a, and the connectors 330a are laterally covered by a passivation layer 332a. A plurality of connectors 330b are formed on and connected to the second die 302b, and the connectors 330b are laterally covered by a passivation layer 332b. In some alternative embodiments, the second die 302b may have contacts thereon. In addition, an adhesive layer 320a is provided over the back side of the first die 302a (that is, the side away from the contacts 304a). Another adhesive layer 320b is provided over the back side of the second die 302b.

In FIG. 3, the first and second RDL structures 130 and 160 are front-side redistribution layers. In some embodiments, the conductive connectors 168 may be bumps, C4 bumps or BGA balls. In the case, as shown in FIG. 3, the conductive connectors 168 are C4 bumps.

Figure 4:
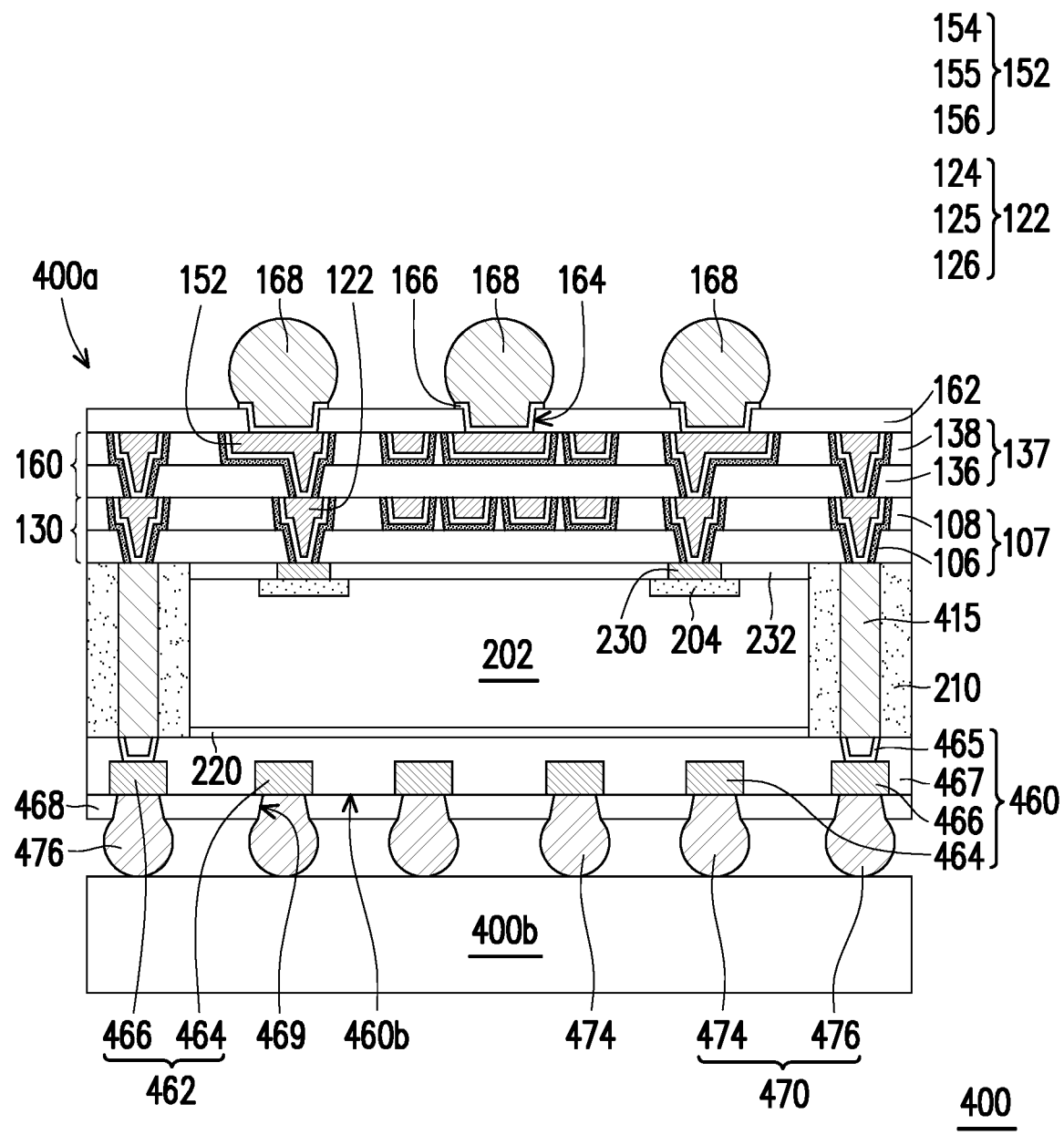
FIG. 4 is a cross-sectional view of a package in accordance with a fourth embodiment.

FIG. 4 is a cross-sectional view of a package in accordance with a fourth embodiment.

Referring to FIG. 4, a package-on-package (POP) structure 400 includes an InFO package 400a and another package 400b bonding together through a backside RDL structure 460. In detail, the InFO package 400a is similar to the InFO package 200 of the second embodiment illustrated in FIG. 2. One or more dies 202 described with FIG. 2 may be employed in the following embodiments, and detailed explanation thereof may be omitted. A difference therebetween lies in that the InFO package 400a has a plurality of through interlayer vias (TIVs) 415 encapsulated by the encapsulant 210. In detail, as shown in FIG. 4, the TIVs 415 are aside or surround the die 202 and electrically connect to the first RDL structure 130 and the backside RDL structure 460. In some embodiments, the TIVs 415 include copper, nickel, solder, alloys thereof, or the like. In some alternative embodiments, each of the TIVs 415 includes a conductive pillar and a barrier layer (not shown) surrounding the conductive pillar, the barrier layer is able to prevent metal diffusion or migration. An exemplary forming method of the TIVs 415 includes forming a photoresist layer such as a dry film resist over the carrier (not shown). Thereafter, openings are formed in the photoresist layer, and the TIVs 415 are then formed in the openings by a plating process. Afterwards, the photoresist layer is stripped. In some embodiments, the top surfaces of the TIVs 415 are substantially level with the top surfaces of the connectors 230, so as to provide good planarity for the to-be-formed the first RDL structure 130. In some embodiments, the TIVs 415 are formed before forming the encapsulant 210.

In FIG. 4, the backside RDL structure 460 includes a plurality of conductive features 462 in a dielectric layer 467. In some embodiments, the conductive features 462 may include a plurality of traces embedded in the dielectric layer 467 and a plurality of pads exposed by the dielectric layer 467. The traces may be electrically connected to the pads. Herein, first pads 464 and second pads 466 are illustrated in FIG. 4, the traces are omitted.

In addition, the backside RDL structure 460 further includes a plurality of vias 465 formed between the second pads 466 and the TIVs 415. In some embodiments, a pattern density of the backside RDL structure 460 is less than a pattern density of the first and second RDL structures 130 and 160. Therefore, the backside RDL structure 460 may be formed without the protective layer 118/148. In some alternative embodiments, the pattern density of the backside RDL structure 460 is equal to or greater than the pattern density of the first and second RDL structures 130 and 160. Accordingly, the backside RDL structure 460 may be formed as described in FIG. 1A to FIG. 1J.

After forming the backside RDL structure 460, a dielectric layer 468 is formed on a back side 460b of the backside RDL structure 460. The dielectric layer 468 is patterned and includes a plurality of openings 469 to expose the conductive features 462. Another package 400b with a plurality of conductive terminals 470 is then provided and connect to the conductive features 462 of the backside RDL structure 460. In some embodiments, the another package 400b is, for example, a memory device. The InFO package 400a is stacked over and is electrically connected to the another package 400b through the backside RDL structure 460 and the conductive terminals 470, so that the POP structure 400 of the present embodiment is fabricated.

It should be noted that the conductive terminals 470 may include first BGA balls 474 and second BGA balls 476. The second BGA balls 476 are aside or surround the first BGA balls 474. In some embodiments, the first BGA balls 474 are arranged as an array to meet mass production requirements. In some alternative embodiments, the POP structure 400 may have no first BGA balls 474 in the center region to meet the customer's need.

Figure 5A:
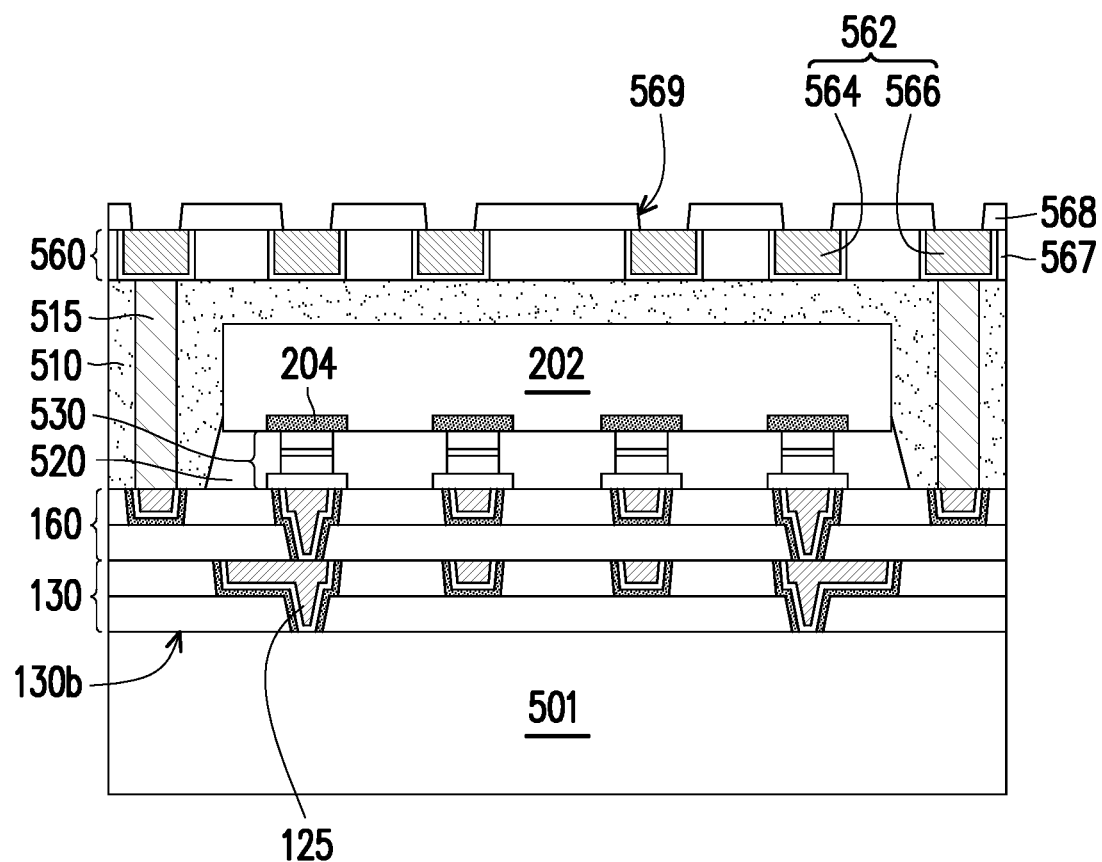
FIG. 5A to FIG. 5B are cross-sectional views of a method of forming a package in accordance with a fifth embodiment.
Figure 5B:
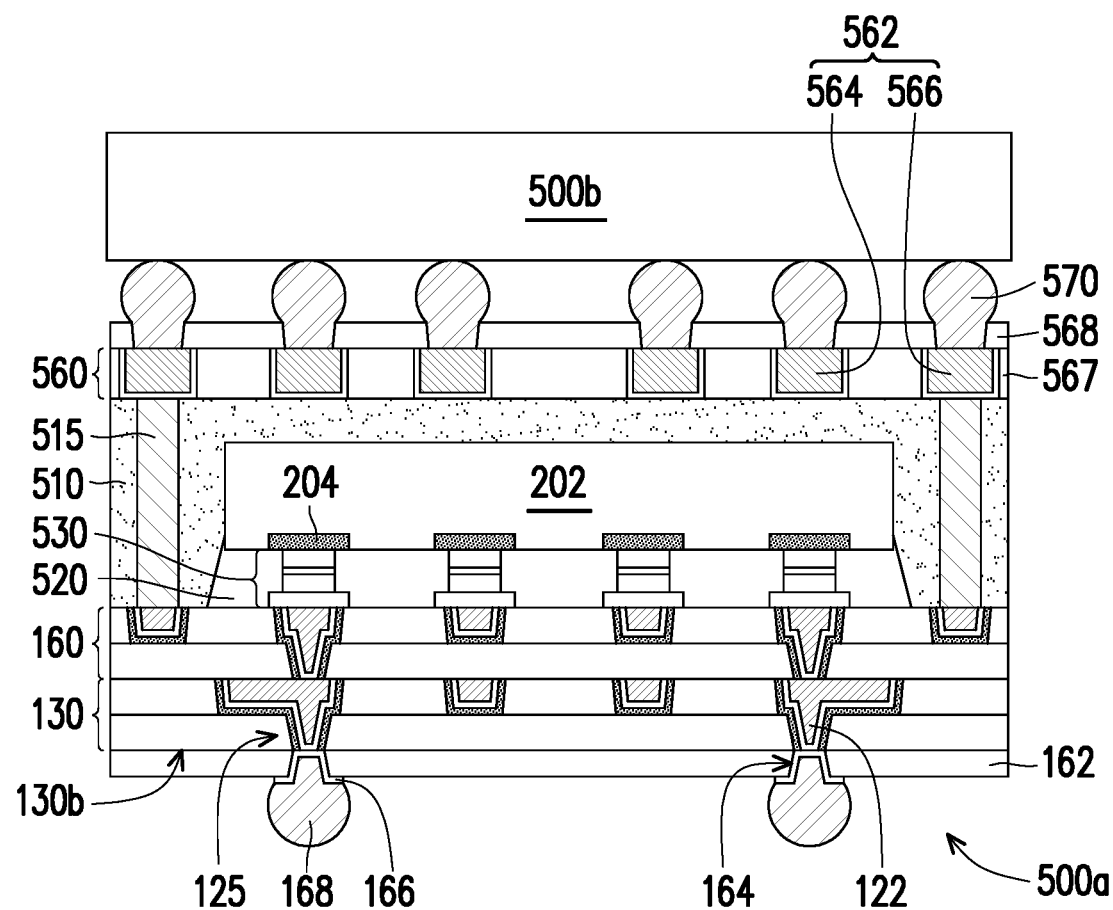

FIG. 5A to FIG. 5B are cross-sectional views of a method of forming a package in accordance with a fifth embodiment.

Referring to FIG. 5A and FIG. 5B, the forming method of a PoP package 500 including an InFO package 500a and another package 500b bonding together through a plurality of conductive terminals 570 includes following steps. First, in some embodiments, the formation of the InFO package 500a may follow redistribution layer first (RDL-first) processes, including forming the first RDL structure 130 and the second RDL structure 160 on a carrier 501 in order, before the placement of the die 202. In some embodiments, the carrier 501 may be a blank glass carrier, a blank ceramic carrier, or the like. The formation of the first and second RDL structures 130 and 160 may follow the same or substantially similar process steps as described in FIG. 1A to FIG. 1I and use the same or similar materials as described in the above embodiments. Thus, details thereof are omitted here.

After forming the first RDL structure 130 and the second RDL structure 160 on the carrier 501, a plurality of TIVs 515 are formed on the second RDL structure 160. The die 202 is then mounted on the second RDL structure 160 in a flip-chip way including turning the die 202 upside down so that the contacts 204 (or the active surface) of the die 202 face toward the second RDL structure 160. The contacts 204 are connected to a plurality of bumps 530 so that the die 202 are bonded to the second RDL structure 160. In some embodiments, the bumps 530 may be micro-bumps. The micro-bumps may be solder bumps, and/or may include metal pillars (e.g., copper pillars), solder caps formed on metal pillars, and/or solder bumps between two metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The bumps 530 may be formed by a suitable process such as evaporation, electroplating, ball drop, or screen printing.

In addition, an underfill 520 is further included between the die 202 and the second RDL structure 160 and laterally encapsulates the bumps 530. An encapsulant 510 is formed to encapsulate the die 202, the underfill 520, and the TIVs 515. After forming the encapsulant 510, the top surface of the encapsulant 510 and the top surfaces of the TIVs 515 are substantially coplanar.

After forming the encapsulant 510, as shown in FIG. 5A, a backside RDL structure 560 is formed on the encapsulant 510 and the TIVs 515. The backside RDL structure 560 includes a plurality of conductive features 562 in a dielectric layer 567. In some embodiments, the conductive features 562 may include a plurality of traces embedded in the dielectric layer 567 and a plurality of pads exposed by the dielectric layer 567. The traces may be electrically connected to the pads. Herein, first pads 564 and second pads 566 are illustrated in FIG. 5A, the traces are omitted. The second pads 566 are electrically connected to the second RDL structure 160 through the TIVs 515.

After forming the backside RDL structure 560, a dielectric layer 568 is formed on the backside RDL structure 560. The dielectric layer 568 is patterned and includes a plurality of openings 569 to expose the conductive features 562.

After forming the openings 569, the carrier 501 is removed to expose the back side 130b of the first RDL structure 130. In FIG. 5B, the vias 125' of the first RDL structure 130 are exposed by the back side 130b of the first RDL structure 130. After removing the carrier 501, the passivation layer 162 is formed on the back side 130b of the first RDL structure 130. The passivation layer 162 is patterned and have a plurality of openings 164 to expose portions of the conductive features 122 of the first RDL structure 130. A plurality of conductive connectors 168 are formed in the openings 164 and electrically connected to the first RDL structure 130. The conductive layer 166 is formed between the conductive connectors 168 and the conductive features 122 and referred as UBM. After forming the conductive connectors 168, the InFO package 500a is bonded to the another package 500b with a plurality of conductive terminals 570 to form the PoP package 500. In some alternative embodiments, the InFO package 500a and the another package 500b bonded together before removing the carrier 501.

Figure 6:
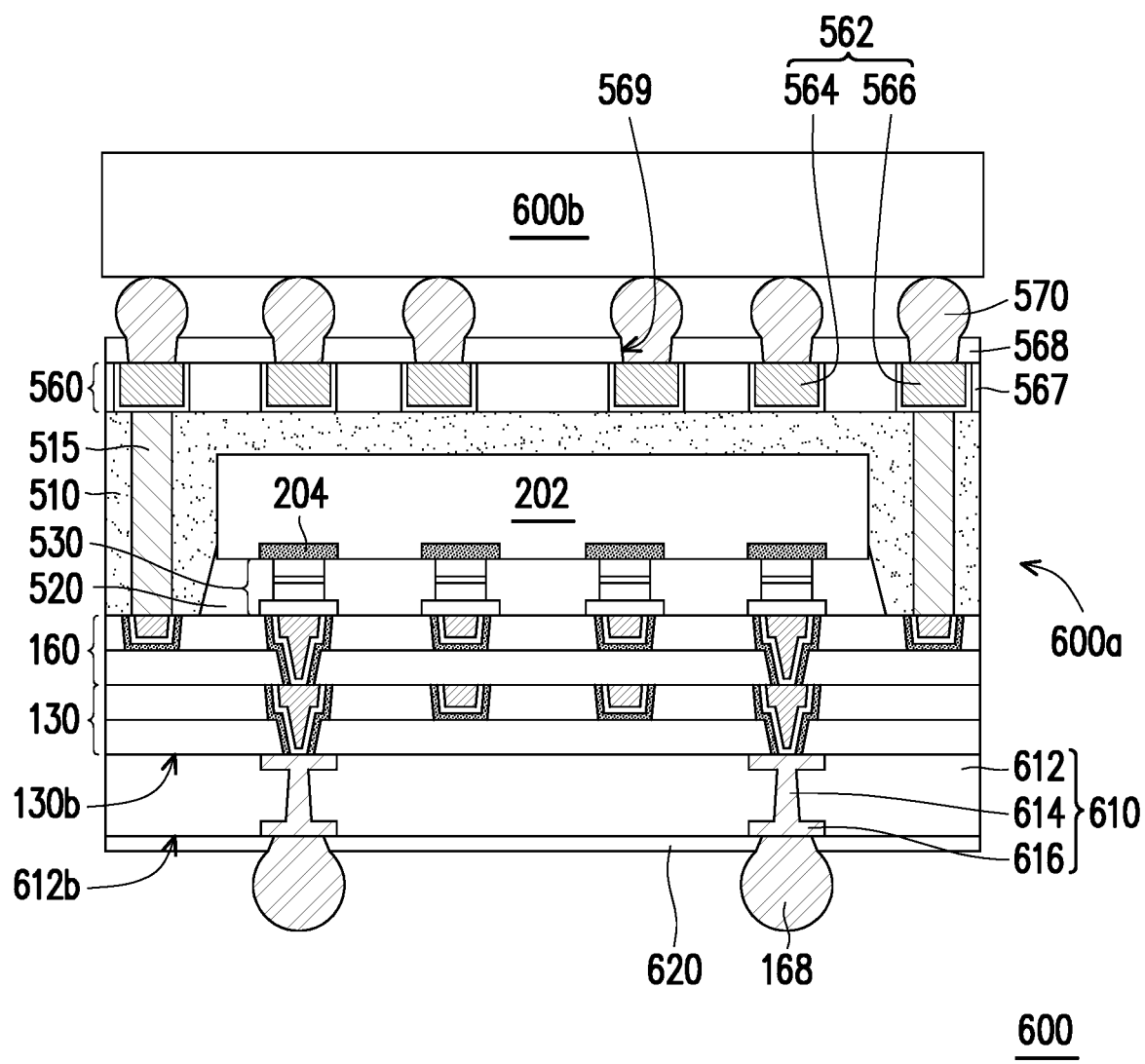
FIG. 6 is a cross-sectional view of a package in accordance with a sixth embodiment.

FIG. 6 is a cross-sectional view of a package in accordance with a sixth embodiment.

Referring to FIG. 6, a PoP package 600 including one package 600a and another package 600b bonded together is formed by following steps. A circuit board laminate 610 is formed on the carrier (as illustrated the carrier 510 in FIG. 5A). In detail, the circuit board laminate 610 includes an insulating layer 612 and a circuit structure 614 embedded in the insulating layer 612. A portion of the circuit structure 614 (hereafter referred as the circuit structure 616) is exposed by the back side 612b of the insulating layer 612. In some embodiments, the insulating layer 612 includes prepreg, ABF, polyimide (PI), polyethylene terephthalate (PET), polyethylene naphthalate (PEN), and/or the like. The circuit structure 614 or 616 may include metal, such as Cu. In some embodiments, the circuit board laminate 610 may be a printed circuit board.

The first RDL structure 130 and the second RDL structure 160 are formed in order on the circuit board laminate 610. In some embodiments, the back side 130b of the first RDL structure 130 is in contact with the circuit board laminate 610. The TIVs 515 are then formed on the second RDL structure 160. The die 202 is flipped and bonded to the second RDL structure 160 through the bumps 530 after forming the TIVs 515. The underfill 520 is formed to encapsulate the bumps 530. The encapsulant 510 is formed to encapsulate the die 202, the underfill 520, and the TIVs 515. Thereafter, a grinding or polishing process is performed to remove a portion of the encapsulant 510 to expose the TIVs 515. After the grinding or polishing process, the top surface of the encapsulant 510 and the top surfaces of the TIVs 515 are substantially coplanar.

Thereafter, the backside RDL structure 560 is formed on the encapsulant 510 and electrically connected to the TIVs 515. The dielectric layer 568 is formed on the backside RDL structure 560 and is then patterned to form the openings 569 that exposes the conductive features 562. The carrier is then removed to expose the circuit structure 616. The conductive connectors 168 are then formed on and connected to the circuit structure 616. After forming the conductive connectors 168, the package 600a is accomplished. Another package 600b with the conductive terminals 570 are bonded to the package 600a through the backside RDL structure 560, so that the PoP package 600 is fabricated. The conductive terminals 570 are connected to the conductive features 562 exposed by the openings 569.

In some embodiments, a solder resist 620 is further formed on the 612b of the insulating layer 612. In some embodiments, the solder resist 620 includes resin, such as epoxy resin, acrylate resin, and/or the like.

Figure 7:
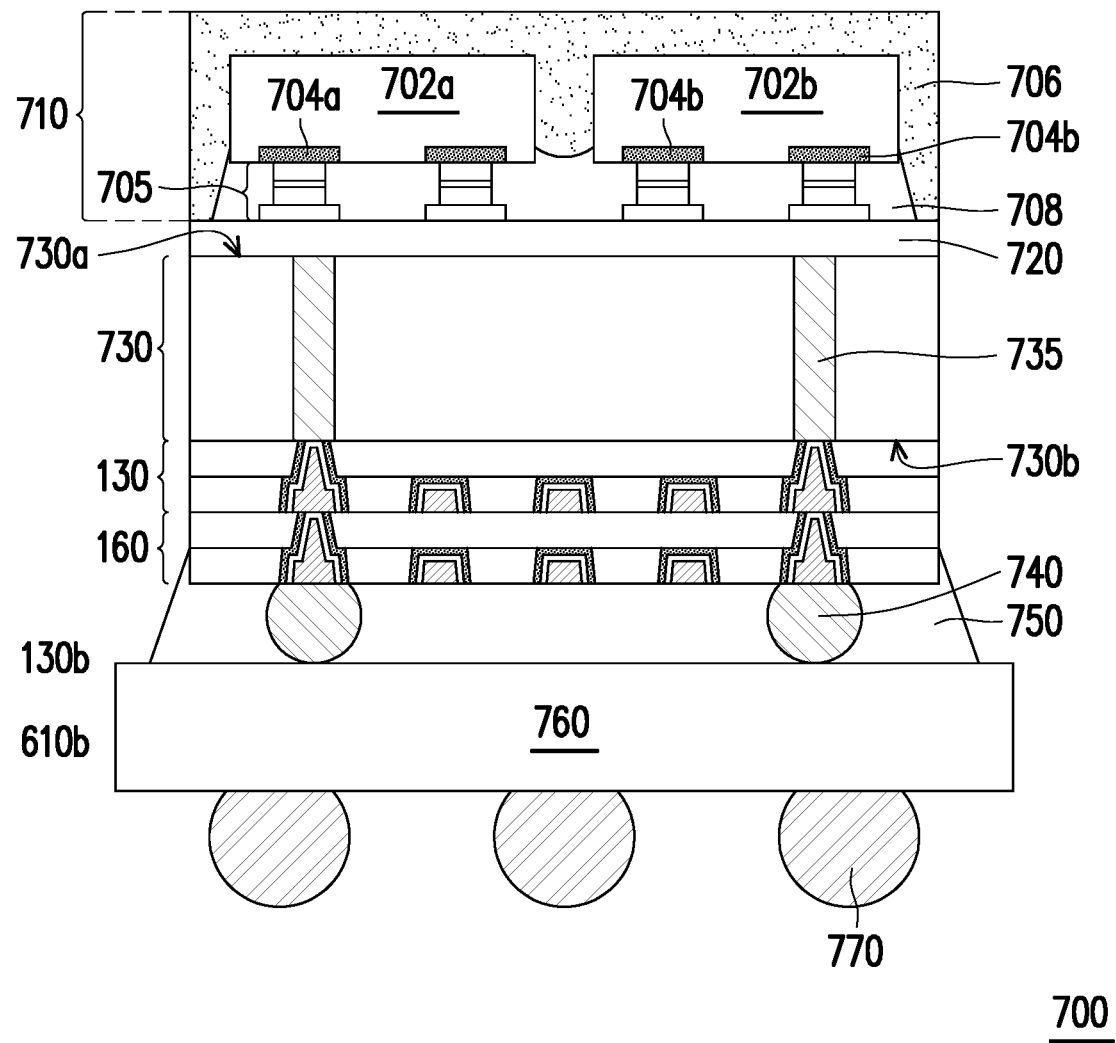
FIG. 7 is a cross-sectional view of a package in accordance with a seventh embodiment.

FIG. 7 is a cross-sectional view of a package in accordance with a seventh embodiment.

Referring to FIG. 7, a package 700 includes a multi-die package 710, an interconnect structure 720, an interposer 730, the first and second RDL structures 130 and 160, a circuit substrate 760, and a plurality of conductive connectors 770. In detail, the multi-die package 710 include a first die 702a with a plurality of contacts 704a and a second die 702b with a plurality of contacts 704b. In some embodiments, the first die 702a and the second die 702b have the same function or different functions. In some alternative embodiments, more than two dies are formed in the multi-die package 710.

In FIG. 7, the interposer 730 having dual-side terminals is provided. The interconnect structure 720 is formed on the front side 730a of the interposer 730 by a back-end-of-line (BEOL) process. The first and second RDL structures 130 and 160 are formed on the back side 730b of the interposer 730 by the fabricating method described in FIG. 1A to FIG. 1J. In some embodiments, a plurality of through silicon vias (TSVs) 735 are included to penetrate the interposer 730. That is, the TSVs 735 extend from the front side 730a to the back side 730b of the interposer 730 and electrically connects to interconnect structure 720 and the first RDL structure 130.

After forming the interconnect structure 720, the first die 702a and the second die 702b are mounted on the interconnect structure 720 in the flip-chip way. That is, the first die 702a is electrically connected to the interconnect structure 720 through the bumps 705 and the contacts 704a, and the second die 702b is electrically connected to the interconnect structure 720 through the bumps 705 and the contacts 704b. In some embodiments, the bumps 705 may be micro-bumps. The bumps 705 is encapsulated by the underfill 708. The first die 702a, the second die 702b, and the underfill 708 are encapsulated by the encapsulant 706 to form the multi-die package 710. In some embodiments, the interconnect structure 720 includes an interconnect circuit (not shown) to electrically connect to the bumps 705 and the TSVs 735.

In FIG. 7, the package 700 further includes a plurality of bumps 740 to connect to second RDL structure 160 and the circuit substrate 760. In some embodiments, the bumps 740 may be C4 bumps. The bumps 740 are encapsulated by the underfill 750. In some embodiments, the circuit substrate 760 is an organic flexible substrate or a printed circuit board, while the conductive connectors 770 are BGA balls. The conductive connectors 770 are electrically connected to the first and second dies 702a and 702b through the circuit substrate 760, the bumps 740, the first and second RDL structures 130 and 160, the TSVs 735, the interconnect structure 720, and the bumps 705. In certain embodiments, the package 700 may be formed by chip on wafer on substrate (CoWoS) packaging processes.

Figure 8:
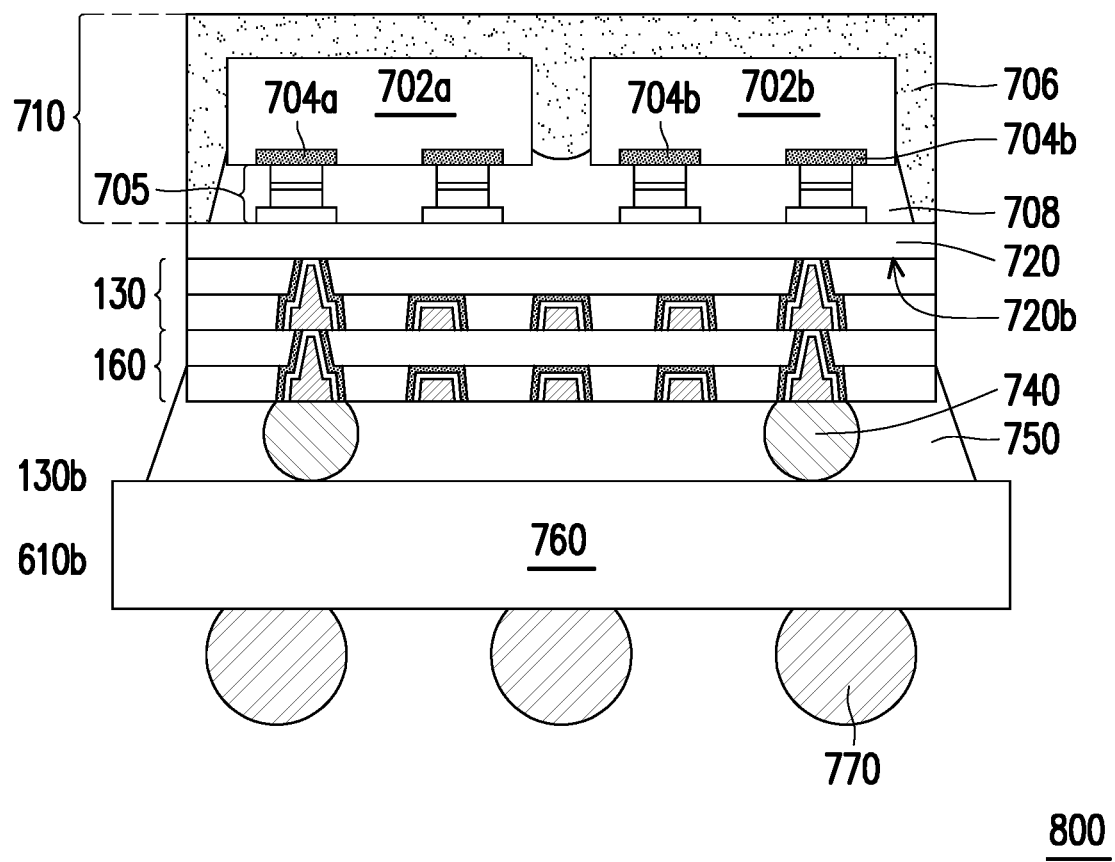
FIG. 8 is a cross-sectional view of a package in accordance with an eighth embodiment.

FIG. 8 is a cross-sectional view of a package in accordance with an eighth embodiment.

Referring to FIG. 8, a package 800 of the eighth embodiment is similar to the package 700 of the seventh embodiment illustrated in FIG. 7. A difference therebetween lies in that the package 800 lacks the interposer 730 and the TSVs 735 in the interposer 730 illustrated in FIG. 7. That is, the conductive connectors 770 are electrically connected to the first and second dies 702a and 702b through the circuit substrate 760, the bumps 740, the first and second RDL structures 130 and 160, the interconnect structure 720, and the bumps 705. In FIG. 8, the first RDL structure 130 is directly formed on the back side 720b of the interconnect structure 720, so that the interconnect structure 720 is located between the multi-die package 710 and the first RDL structure 130.

FIG. 9A to FIG. 9L are cross-sectional views of a method of forming a package in accordance with a ninth embodiment.

Figure 9A:
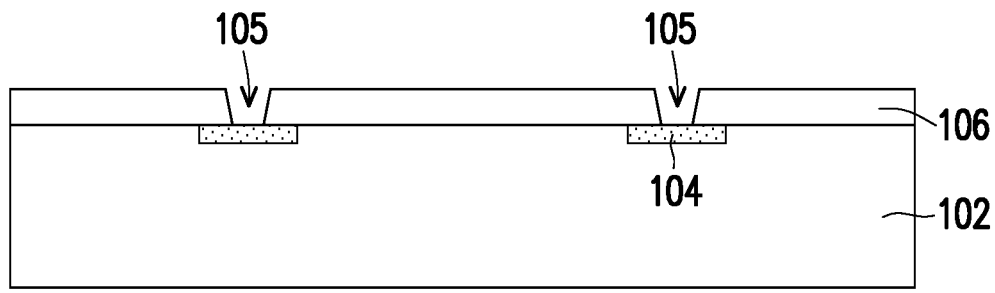
FIG. 9A to FIG. 9L are cross-sectional views of a method of forming a package in accordance with a ninth embodiment.

Referring to FIG. 9A, a die 102 having a plurality of contacts 104 is provided. A first dielectric material 106 having a plurality of via openings 105 is formed on the die 102. Since the structure illustrated in FIG. 9A is similar to the structure illustrated in FIG. 1A, the details thereof are omitted here.

Figure 9B:
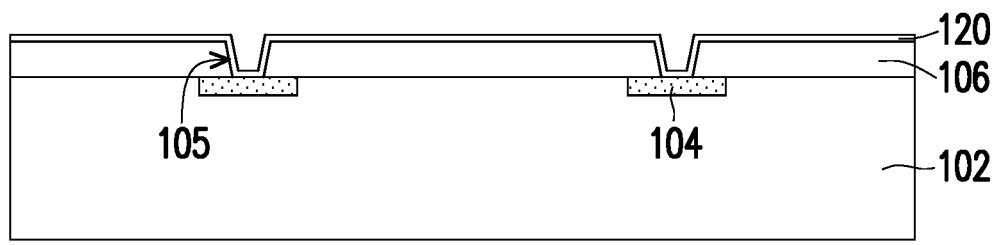

Referring to FIG. 9B, a seed layer 120 is formed on the die 102. The seed layer 120 conformally covers the top surface of the first dielectric material 106 and the surface of the via openings 105. In some embodiments, the seed layer 120 is a metal layer, which may be a single layer or a composite layer including a plurality of sub-layers formed of different materials. In other embodiments, the seed layer 120 is, for example, a titanium/copper composited layer, wherein the sputtered titanium thin film is in contact the contacts 104 of the die 102, and the sputtered copper thin film is then formed over the sputtered titanium thin film. In some alternative embodiments, the seed layer 120 may be other suitable composited layer such as metal, alloy, barrier metal, or a combination thereof.

Figure 9C:
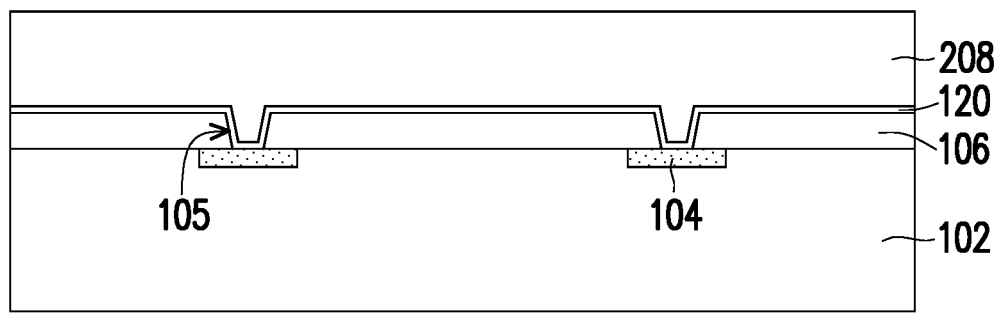

Referring to FIG. 9C, a photoresist layer 208 is formed on the seed layer 120. In detail, the seed layer 120 is filled in the via openings 105 and extends to cover the top surface of the seed layer 120.

Figure 9D:
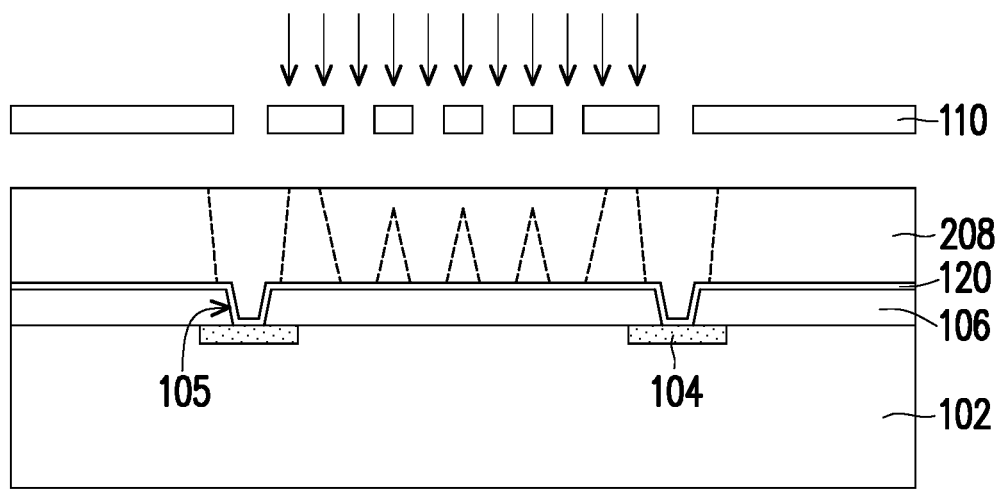
Figure 9E:
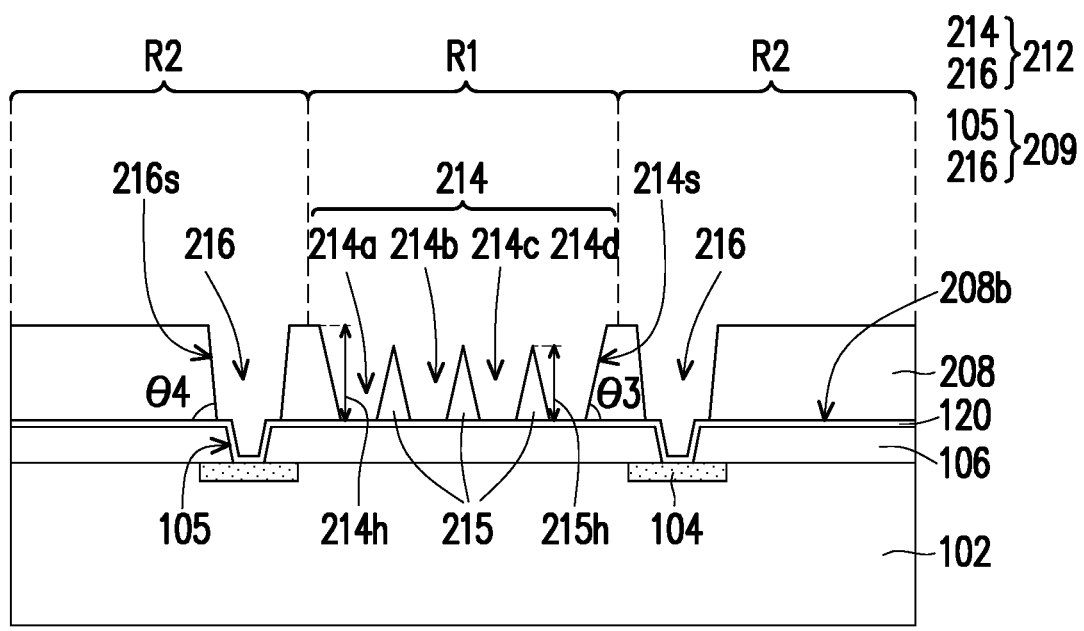

Referring to FIG. 9D and FIG. 9E, the photoresist layer 208 is patterned or partially removed to form a plurality of trench openings 212 in the photoresist layer 208 and form the via openings 105 in the first dielectric material 106. In the embodiment, the patterning method may include a lithographic process (which includes exposure and development processes) or a laser ablation process by using a mask 110.

After patterning the photoresist layer 208, as shown in FIG. 9E, the trench openings 212 and the via openings 105 are formed. In detail, the trench openings 212 includes a first trench opening 214 in the first region R1 and second trench openings 216 in the second region R2. The first region R1 is aside or surrounded by the second region R2. In some embodiments, the first region R1 is referred as a dense region and the second region R2 is referred as a sparse region. Herein, the dense region is referred as a pitch between sub-openings 214a, 214b, 214c, and 214d of the first trench openings 214 less than a pitch between the first trench opening 214 and the second trench opening 216 (or a pitch between one and another second trench openings 216). As shown in FIG. 9E, the sub-openings 214a, 214b, 214c, and 214d constitute as the first trench opening 214 with a plurality of comb portions 215. The comb portions 215 extend from a top surface of the seed layer 120 upward. In some embodiments, a height 215h of the comb portions 215 is less than or equal to a depth 214h of the first trench opening 214.

As shown in FIG. 9E, the second trench openings 216 are formed on and in spatial communication with the via openings 105. The joined second trench openings 216 and via openings 105 constitute as connection openings 209. The connection openings 209 expose the contacts 104 of the die 102. In some embodiments, the first trench openings 214 expose the seed layer 120. That is, the seed layer 120 is located on the bottom surfaces of the first trench openings 214 and the sidewalls and the bottom surfaces of the via openings 105.

As shown in FIG. 9E, the first trench opening 214 has a sidewall 214s. In some embodiments, an included angle θ3 exists between the sidewall 214s of the first trench opening 214 and the bottom surface 208b of the photoresist layer 208. Similarly, the second trench opening 216 has a sidewall 216s. An included angle θ4 exists between the sidewall 216s of the second trench opening 216 and the bottom surface 208b of the photoresist layer 208. The included angle θ3 and the included angle θ4 may be the same or different. The included angles θ3 and θ4 may be adjusted by using different materials for the photoresist layer 208 and controlling the associated removal process conditions. In some embodiments, the included angles θ3 and θ4 are respectively ranging from 80 degrees to 90 degrees.

Figure 9F:
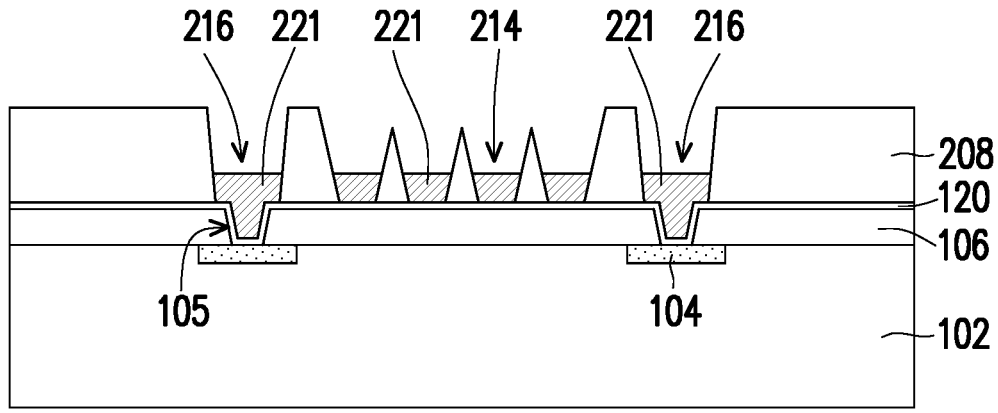

Referring to FIG. 9E and FIG. 9F, a conductive material 221 is formed on the seed layer 120 in the connection openings 209 (including the via openings 105 and the second trench opening 216 spatial communicated with each other) and in the first trench opening 214 by a plating process, for example. In some embodiments, the conductive material 221 includes copper or other suitable metal, for example. In some alternative embodiments, a height of the conductive material 221 is less than the height 215h of the comb portions 215. However, the embodiments of the present invention are not limited thereto.

Figure 9G:
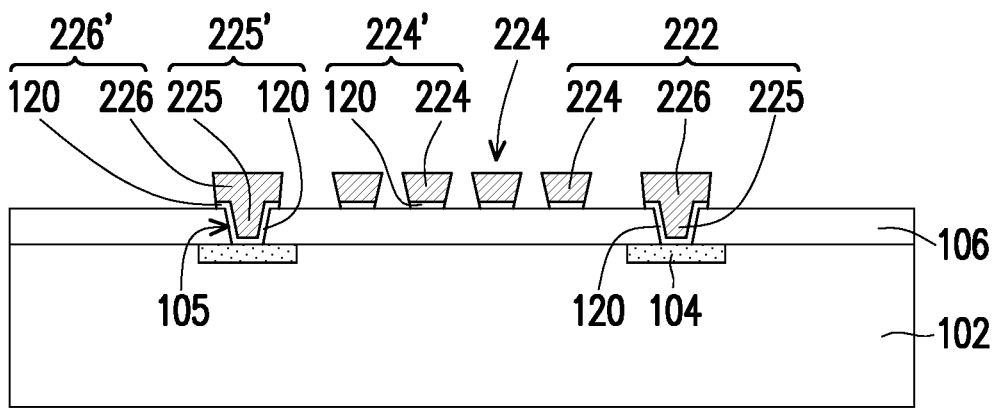

Referring to FIG. 9F and FIG. 9G, the photoresist layer 208 is removed and the seed layer 120 uncovered by the conductive material 221 is also removed. In the case, as shown in FIG. 9G, a plurality of the conductive features 222 are formed on the die 102. In detail, the conductive features 222 includes a plurality of first conductive patterns 224 in the first region R1 and a plurality of second conductive patterns 226 and a plurality of third conductive patterns 225 in the second region R2. The first conductive patterns 224 are separated from each other. The seed layer 120 is formed between the first conductive patterns 224 and the first dielectric material 106. In some embodiments, the first conductive patterns 224 and the seed layer 120 formed on the bottom surfaces of the first conductive patterns 224 constitute first traces 224'. The first traces 224' extend along a direction parallel to the top surface of the die 102. The second conductive patterns 226 are formed on the third conductive patterns 225 respectively and the joined second conductive pattern 226 and third conductive pattern 225 constitute as a conductive structure 229. The seed layer 120 is formed on the sidewalls and the bottom surfaces of the third conductive patterns 225. The seed layer 120 further extends to cover a portion of the top surface of the first dielectric material 106, so that the seed layer 120 is sandwiched between the conductive patterns 226 and the first dielectric material 106. As shown in FIG. 9G, the seed layer 120 on the bottom surfaces of the third conductive patterns 225 are in contact with the contacts 104 of the die 102. In some embodiments, the second conductive patterns 226 and the seed layer 120 formed between the second conductive patterns 226 and the first dielectric material 106 constitute second traces 226'. The second traces 226' extend along a direction parallel to the top surface of the die 102. The third conductive patterns 225 and the seed layer 120 formed on the bottom surface and the sidewalls of the third conductive patterns 225 constitute vias 225'. The vias 225' extend along a direction perpendicular to the top surface of the die 102.

Figure 9H:
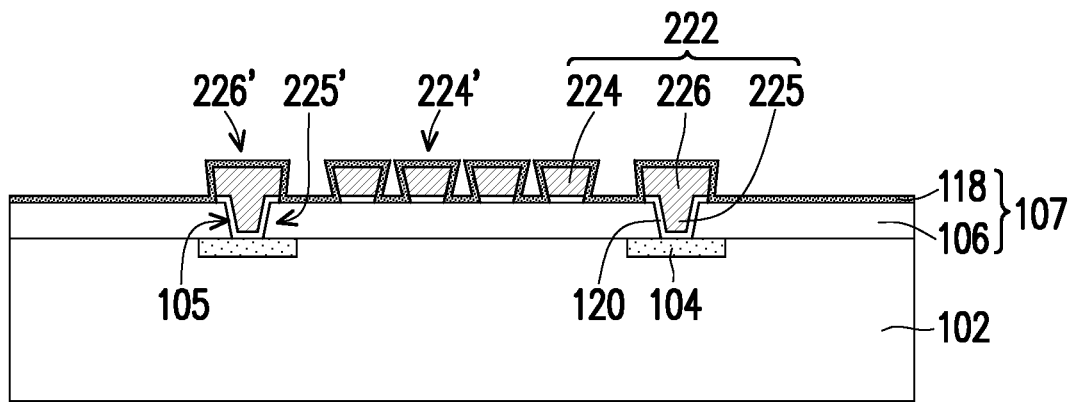

Referring to FIG. 9H, a protective layer 118 is formed on the conductive features 222. The protective layer 118 conformally covers the sidewalls and the top surfaces of the first traces 224, the sidewalls and the top surfaces of the second traces 226, and the top surface of the first dielectric material 106. In some embodiments, the protective layer 118 includes an inorganic dielectric material. The inorganic dielectric material may include an oxide (such as silicon oxide), a nitride (such as silicon nitride), an oxynitride (such as silicon oxynitride), a carbide (such as silicon carbide), or a combination thereof, for example. The method of forming the protective layer 118 is, for example, a CVD process, a PVD process, or an ALD process. In other embodiments, a thickness of the protective layer 118 is less than 1 μm. Herein, when a layer described as "conformally cover", the layer is formed with an uniform thickness. In an embodiment, the protective layer 118 and the seed layer 120 include different materials.

Figure 9I:
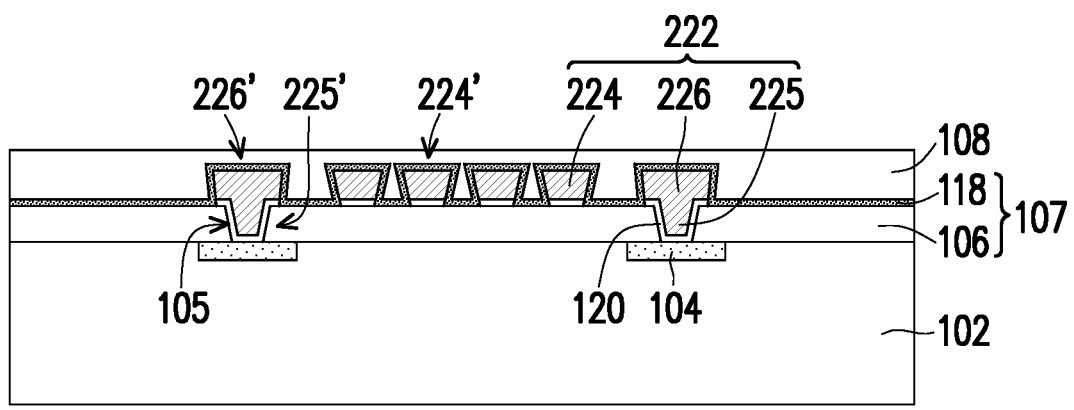

Referring to FIG. 9I, a second dielectric material 108 is formed on the protective layer 118. The second dielectric material 108 may be a single layer or a multilayer structure, for example. In some embodiments, the second dielectric material 108 and the first dielectric material 106 may include the same material or different materials. The material and forming method of the first and second dielectric materials 106 and 108 are described in the above embodiments. Thus, details thereof are omitted here. In an embodiment, the second dielectric material 108 and the protective layer 118 includes different materials.

Figure 9J:
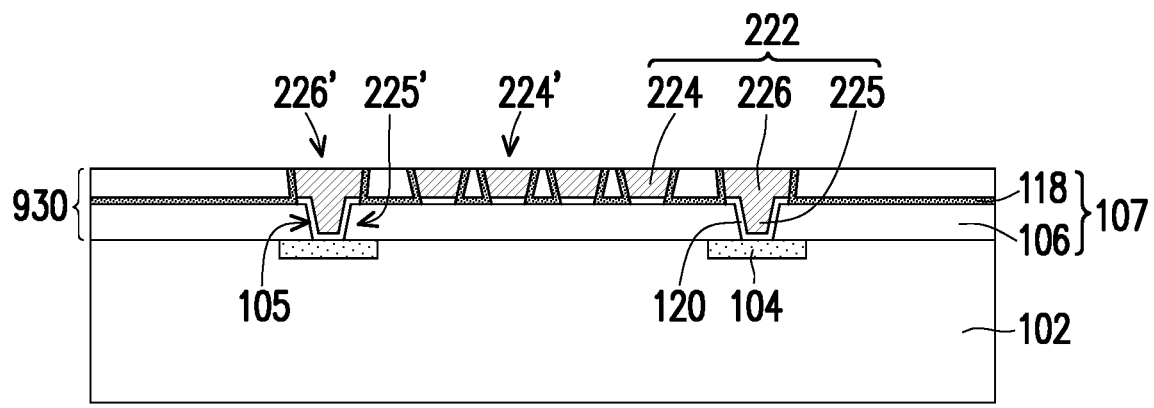

Referring to FIG. 9I and FIG. 9J, a planarization process is performed to remove portions of the second dielectric material 108 and the protective layer 118 until the conductive features 222 are exposed. In some embodiments, the planarization process includes a CMP process, a mechanical grinding process, a fly cutting process or an etching back process. In certain embodiments, after the planarization process, the formation of the first RDL structure 930 is completed. Specifically, the first RDL structure 930 includes a dielectric layer 107 (which includes the first and second dielectric materials 106 and 108), the conductive features 222 formed in the dielectric layer 107, the seed layer 120 formed on the bottom surface of the vias 225', and the protective layer 118 at least formed on the sidewalls of the first traces 224' and the second traces 226'. In some embodiments, the protective layer 118 further extends from the sidewall of the first and second traces 224' and 226' to cover the top surface of the first dielectric material 106. That is, the protective layer 118 is formed between the first and second dielectric materials 106 and 108. In some alternative embodiments, the top surface of the dielectric layer 107 and the top surfaces of the conductive features 222 are substantially coplanar or at the same level after the planarization process. In certain embodiments, the formed first RDL structure 930 provides good planarity for the to-be-formed upper layers.

Figure 9K:
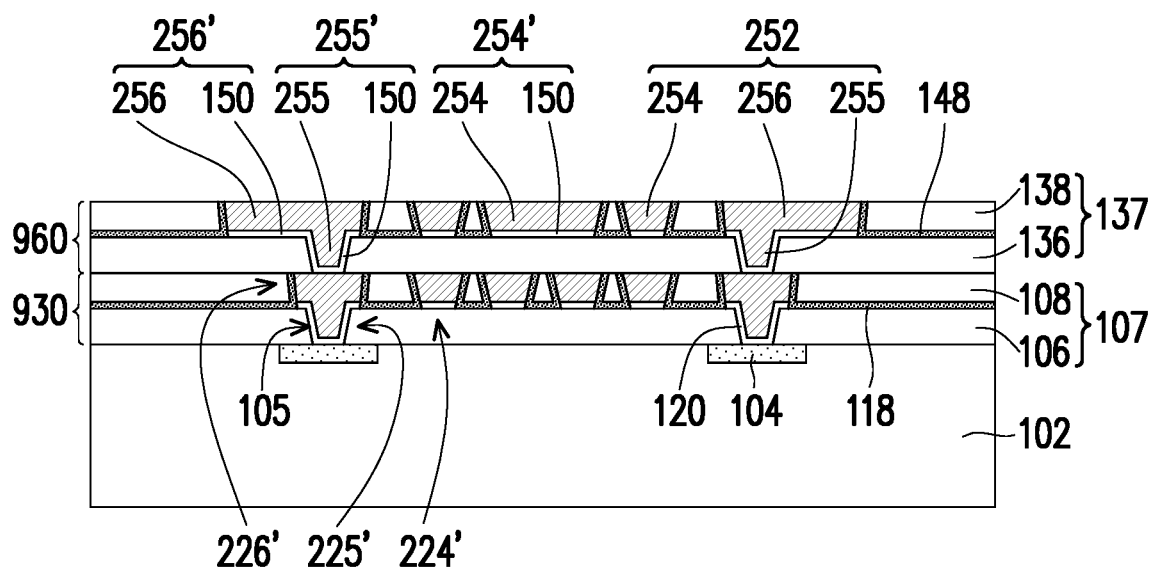

Referring to FIG. 9J and FIG. 9K, a second RDL structure 960 is formed on the first RDL structure 930. The formation of the second RDL structure 960 may follow the same or substantially similar process steps as described in FIG. 9A to FIG. 9J and use the same or similar materials as described in the above embodiments. In some embodiments, the second RDL structure 960 is disposed on the first RDL structure 930 and is electrically connected with the first RDL structure 930. In some embodiments, the second RDL structure 960 includes a dielectric layer 137 and a plurality of conductive features 252 formed in the dielectric layer 137. In some embodiments, the dielectric layer 137 may include a first dielectric material 136 and a second dielectric material 138 on the first dielectric material 136. In some embodiments, the conductive features 252 include a plurality of first conductive patterns 254 in the second dielectric material 138 within the first region R1, a plurality of second conductive patterns 256 in the second dielectric material 138 within the second region R2, and a plurality of third conductive patterns 255 in the first dielectric material 136 within the second region R2. In some embodiments, the second conductive pattern 256 is formed on the third conductive pattern 255. The first conductive patterns 254 are separated from each other. In some embodiments, the first conductive patterns 254 and the seed layer 150 formed on the bottom surfaces of the first conductive patterns 254 constitute first traces 254'. The first traces 254' extend along a direction parallel to the top surface of the die 102. The second conductive patterns 256 and the seed layer 150 formed between the second conductive patterns 256 and the first dielectric material 136 constitute second traces 256'. The second traces 256' extend along a direction parallel to the top surface of the die 102. The third conductive patterns 255 and the seed layer 150 formed on the bottom surface and the sidewalls of the third conductive patterns 255 constitute vias 255'. The vias 255' extend along a direction perpendicular to the top surface of the die 102.

The second RDL structure 960 further includes a protective layer 148. As shown in FIG. 9K, the protective layer 148 further extends from the sidewall of the first and second traces 254' and 256' to cover the top surface of the first dielectric material 136. That is, the protective layer 148 is formed on the sidewalls of the first traces 254' and the second traces 256', and extends between the first and second dielectric materials 136 and 138. In some alternative embodiments, the top surface of the dielectric layer 137 and the top surfaces of the conductive features 252 are substantially coplanar or at the same level. In some embodiments, the protective layer 148 and the seed layer 150 include different materials.

Although only two RDL structures 930 and 960 are illustrated in FIG. 9K, the embodiments of the present invention are not limited thereto. In some embodiments, one or more RDL structures are formed between the first RDL structure 930 and the second RDL structure 960. That is, one or more dielectric layers and conductive features formed in the one or more dielectric layers are included in the RDL structures. However, the layout or the arrangement of the RDL structures is not limited by the embodiments described herein.

Figure 9L:
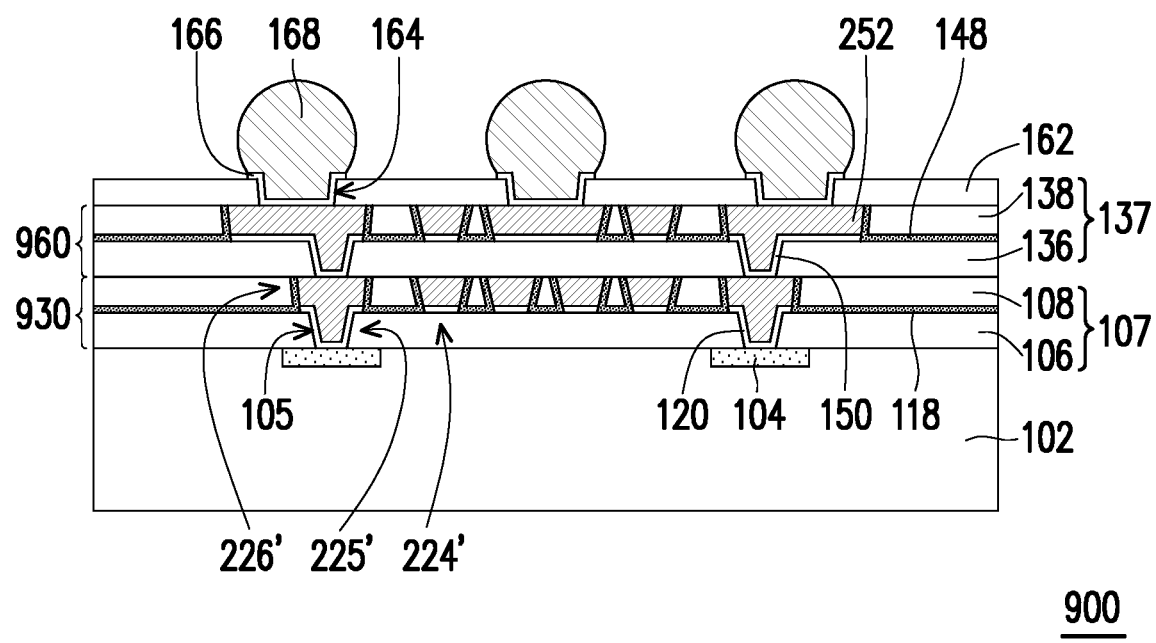

Referring to FIG. 9K and FIG. 9L, after the second RDL structure 960 is formed, a passivation layer 162 is formed on the second RDL structure 960. Thereafter, a plurality of openings 164 are formed in the passivation layer 162. The openings 164 expose portions of the conductive features 252 of the second RDL structure 960. A conductive layer 166 is then formed on the conductive features 252 exposed by the openings 164. The conductive layer 166 is also referred to as under-ball metallurgy (UBM). In some embodiments, the conductive layer 166 covers the sidewalls and the bottoms of the openings 164 and extends to cover the passivation layer 162. The conductive layer 166 is electrically connected to the contacts 104 of the die 102 through the first and second RDL structures 930 and 960.

Thereafter, a plurality of conductive connectors (also referred to as conductive balls) 168 is placed on the conductive layer 166. After the conductive connectors 168 are formed, as shown in FIG. 9L, the package 900 of the ninth embodiment of the disclosure is thus completed. The conductive connectors 168 are electrically connected to the contacts 104 of the die 102 through the conductive layer 166 and the first and second RDL structures 930 and 960.

In FIG. 9L, the first and second RDL structures 930 and 960 are front-side redistribution layers formed on the active surface of the die 102. In some embodiments, the structure in FIG. 9L may be a WLCSP structure. In some alternative embodiments, the die 102 and the first and second RDL structures 930 and 960 have substantially the same size. In the case, the package 900 may be an integrated fan-in package. However, the embodiments of the present invention are not limited thereto. In other embodiments, the first and second RDL structures 930 and 960 with the protective layers 118 and 148 illustrated in FIG. 9L are able to apply in various packages. That is, the first and second RDL structures 930 and 960 illustrated in FIG. 9L is able to replace the first and second RDL structures 130 and 160 illustrated in FIG. 2 to FIG. 8. Therefore, the packages having the RDL structures with the protective layer are able to increase the breakdown voltage of the RDL structures, so that the packages achieve the fine pitch RDL or high density RDL.

According to some embodiments, a method of fabricating a package includes: providing a die with a contact thereon; forming a redistribution layer (RDL) structure on the die, the forming the RDL structure on the die comprising: forming a first dielectric material on the die; forming a conductive feature in and partially on the first dielectric material; after the forming the conductive feature, forming a protective layer on the conductive feature, wherein the protective layer covers a top surface of the conductive feature and extends to cover a top surface of the first dielectric material; forming a second dielectric material on the protective layer; and performing a planarization process to expose the conductive feature; and forming a plurality of conductive connectors to electrically connect the die through the RDL structure.

According to some embodiments, a package include: a die; and a redistribution layer (RDL) structure electrically connected to the die, wherein the RDL structure comprises: a dielectric layer comprising a first dielectric material and a second dielectric material over the first dielectric material; a conductive feature electrically connected to the die, wherein the conductive feature comprises a plurality of first conductive patterns disposed over the first dielectric material and embedded in the second dielectric material; and a first protective layer extending between two adjacent first conductive patterns and being in contact with a top surface of the first dielectric material, wherein the two adjacent first conductive patterns are electrically isolated by the first protective layer therebetween.

According to some embodiments, a package structure includes: a die having a front side and a back side; an encapsulant laterally encapsulating the die; and a first redistribution layer (RDL) structure disposed over the front side of the die and the encapsulant, wherein the first RDL structure comprises: a dielectric layer comprising a first dielectric material and a second dielectric material over the first dielectric material; a conductive feature electrically connected to the die, wherein the conductive feature comprises a plurality of first conductive patterns disposed over the first dielectric material and embedded in the second dielectric material; and a first protective layer extending between two adjacent first conductive patterns and being in contact with a top surface of the first dielectric material, so as to form a U-shape in cross-section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package, comprising:
   providing a die with a contact thereon;
   forming a redistribution layer (RDL) structure on the die, the forming the RDL structure on the die comprising:
      forming a first dielectric material on the die;
      forming a conductive feature in and partially on the first dielectric material, wherein the conductive feature has a top surface higher than a top surface of the first dielectric material;
      after the forming the conductive feature, forming a protective layer on the conductive feature, wherein the protective layer covers the top surface of the conductive feature and extends to cover the top surface of the first dielectric material;
      forming a second dielectric material on the protective layer; and
      performing a planarization process to remove a portion of the second dielectric material and a portion of the protective layer until the conductive feature is exposed; and
   forming a plurality of conductive connectors to electrically connect the die through the RDL structure.

2. The method of claim 1, wherein the forming a conductive feature comprises:
   forming a via opening in the first dielectric material to expose the contact of the die;

forming a seed layer on the die to cover the via opening;
forming a photoresist layer on the seed layer;
patterning the photoresist layer to form a trench opening in the photoresist layer;
performing a plating process to form the conductive feature in the via opening and the trench opening; and
removing the photoresist layer and the seed layer not covered by the conductive feature.

3. The method of claim 2, wherein after the performing the planarization process, the conductive feature comprises:
a plurality of first traces disposed on the first dielectric material and embedded in the second dielectric material, wherein a first portion of the seed layer is sandwiched between the plurality of first traces and the first dielectric material.

4. The method of claim 3, wherein the conductive feature further comprises:
a plurality of vias embedded in the first dielectric material; and
a plurality of second traces respectively disposed on the plurality of vias and embedded in the second dielectric material, wherein a second portion of the seed layer lining bottom surfaces and sidewalls of the plurality of vias, and the seed layer is free of between the plurality of vias and the plurality of second traces.

5. The method of claim 3, wherein a portion of the protective layer extends between two adjacent first traces to form a U-shape in cross-section, and the two adjacent first traces are electrically isolated by the portion of the protective layer therebetween.

6. The method of claim 1, wherein the protective layer comprises an inorganic dielectric material.

7. The method of claim 6, wherein the inorganic dielectric material comprises an oxide, a nitride, an oxynitride, a carbide, or a combination thereof.

8. The method of claim 1, wherein the protective layer and the second dielectric material have different materials.

9. The method of claim 1, wherein the planarization process comprises a chemical-mechanical polishing (CMP) process, a mechanical grinding process, a fly cutting process or an etching back process.

10. A package, comprising:
a die; and
a redistribution layer (RDL) structure electrically connected to the die, wherein the RDL structure comprises:
a dielectric layer comprising a first dielectric material and a second dielectric material over the first dielectric material;
a conductive feature electrically connected to the die, wherein the conductive feature comprises a plurality of first conductive patterns, and the plurality of first conductive patterns is disposed on and wholly above a top surface of the first dielectric material and embedded in the second dielectric material;
a first seed layer sandwiched between a bottom surface of each first conductive pattern of the plurality of first conductive patterns and the top surface of the first dielectric material, wherein the first seed layer is in direct contact with and completely covers the entire bottom surface of each first conductive pattern of the plurality of first conductive patterns; and
a first protective layer extending between two adjacent first conductive patterns and being in contact with the top surface of the first dielectric material, wherein the two adjacent first conductive patterns are electrically isolated by the first protective layer that extends over and covers sidewalls of the two adjacent first conductive patterns and sidewalls of the first seed layer.

11. The package of claim 10, wherein the conductive feature further comprises a second conductive pattern and a third conductive pattern, the second conductive pattern is disposed in the second dielectric material, the third conductive pattern is disposed in the first dielectric material, and the second conductive pattern is disposed over and in contact with the third conductive pattern.

12. The package of claim 11, wherein the RDL structure further comprises:
a second protective layer extending between the second conductive pattern and a corresponding first conductive pattern adjacent to the second conductive pattern to form a U-shape in cross-section; and
a second seed layer lining a bottom surface and a sidewall of the third conductive pattern, wherein a sidewall of the second conductive pattern is in contact with and covered by the second protective layer.

13. The package of claim 12, wherein the first and second protective layers are conformal layers.

14. The package of claim 12, wherein the first and second protective layers each comprises an inorganic dielectric material and the inorganic dielectric material comprises an oxide, a nitride, an oxynitride, a carbide, or a combination thereof.

15. The package of claim 10, further comprising an encapsulant laterally encapsulating the die, wherein the RDL structure is disposed over the encapsulant and the die.

16. A package structure, comprising:
a die having a front side and a back side;
an encapsulant laterally encapsulating a sidewall of the die; and
a first redistribution layer (RDL) structure disposed over the front side of the die and the encapsulant, wherein the first RDL structure comprises:
a dielectric layer comprising a first dielectric material and a second dielectric material over the first dielectric material;
a conductive feature electrically connected to the die, wherein the conductive feature comprises a plurality of first conductive patterns, the plurality of first conductive patterns is disposed on and wholly above a top surface of the first dielectric material and embedded in the second dielectric material; and
a first protective layer extending between two adjacent first conductive patterns and being in contact with the top surface of the first dielectric material, so as to form a U-shape in cross-section, wherein the first protective layer having a substantially same and uniform thickness to conformally covers sidewalls of the two adjacent first conductive patterns and the top surface of the first dielectric material,
wherein the plurality of first conductive patterns extend on the top surface of the first dielectric material without extending into the die, and the first protective layer covers the sidewalls of plurality of first conductive patterns without extending to contact bottom surfaces of the plurality of first conductive patterns.

17. The package structure of claim 16, wherein the conductive feature further comprises a second conductive pattern and a third conductive pattern, the second conductive pattern is disposed in the second dielectric material, the third conductive pattern is disposed in the first dielectric material, and the second conductive pattern is disposed over and in contact with the third conductive pattern.

18. The package structure of claim 17, wherein the RDL structure further comprises:
- a second protective layer extending between the second conductive pattern and a corresponding first conductive pattern adjacent to the second conductive pattern to form a U-shape in cross-section;
- a first seed layer sandwiched only between a bottom surface of each first conductive pattern of the plurality of first conductive patterns and the top surface of the first dielectric material; and
- a second seed layer only lining a bottom surface and a sidewall of the third conductive pattern.

19. The package structure of claim 16, further comprising:
- a second RDL structure disposed over the back side of the die; and
- a plurality of through interlayer vias (TIVs) aside the die and encapsulated by the encapsulant, wherein the TIVs is electrically connected to the first and second RDL structures.

20. The package structure of claim 16, wherein the first protective layer comprises an inorganic dielectric material and the inorganic dielectric material comprises an oxide, a nitride, an oxynitride, a carbide, or a combination thereof.

* * * * *